(12) United States Patent
Clayton et al.

(10) Patent No.: US 8,837,141 B2
(45) Date of Patent: Sep. 16, 2014

(54) ELECTRONIC MODULE WITH HEAT SPREADING ENCLOSURE

(71) Applicants: James E. Clayton, Raleigh, NC (US); Zakaryae Fathi, Raleigh, NC (US)

(72) Inventors: James E. Clayton, Raleigh, NC (US); Zakaryae Fathi, Raleigh, NC (US)

(73) Assignee: Microelectronics Assembly Technologies, Research Triangle Park, NC (US)

( * ) Notice: Subject to any disclaimer, the term of this patent is extended or adjusted under 35 U.S.C. 154(b) by 217 days.

(21) Appl. No.: 13/573,968

(22) Filed: Oct. 17, 2012

(65) Prior Publication Data
US 2014/0104786 A1    Apr. 17, 2014

(51) Int. Cl.
*H05K 7/20* (2006.01)
*H05K 3/10* (2006.01)
*G06F 1/20* (2006.01)

(52) U.S. Cl.
USPC .................. 361/679.54; 361/679.31; 361/704; 361/715; 361/749; 438/65; 438/67; 438/637; 29/842; 29/843; 29/830; 29/846

(58) Field of Classification Search
USPC .......... 361/679.31, 679.46–679.54, 704–712, 361/715, 719, 720, 737, 749, 760, 776; 439/65, 67, 61, 92, 70, 637; 165/80.2, 165/80.3, 104.33, 185; 257/706–727, 698, 257/777; 174/16.3, 252; 29/825–852
See application file for complete search history.

(56) References Cited

U.S. PATENT DOCUMENTS

| | | | |
|---|---|---|---|
| 4,426,689 A * | 1/1984 | Henle et al. ..................... 365/52 |
| 4,656,605 A | 4/1987 | Clayton |
| 4,727,513 A | 2/1988 | Clayton |
| 4,850,892 A | 7/1989 | Clayton |
| 5,161,986 A * | 11/1992 | Gulbranson et al. ............ 439/92 |
| 5,661,339 A | 8/1997 | Clayton |
| 5,708,297 A | 1/1998 | Clayton |
| 5,731,633 A | 3/1998 | Clayton |
| 5,871,362 A * | 2/1999 | Campbell et al. ............... 439/67 |
| 6,049,975 A | 4/2000 | Clayton |
| 6,091,145 A | 7/2000 | Clayton |
| 6,118,291 A * | 9/2000 | Martin et al. ............ 324/750.25 |
| 6,147,411 A * | 11/2000 | Kinsman ........................ 257/777 |
| 6,232,659 B1 | 5/2001 | Clayton |
| 6,238,228 B1 * | 5/2001 | Corisis et al. .................. 439/330 |
| 6,262,583 B1 * | 7/2001 | Martin et al. ............ 324/750.25 |
| 6,268,651 B1 * | 7/2001 | Hellgren et al. ............... 257/692 |

(Continued)

FOREIGN PATENT DOCUMENTS

JP    3424929    2/1996

*Primary Examiner* — Michail V Datskovskiy
(74) *Attorney, Agent, or Firm* — Robert J. Lauf

(57) ABSTRACT

An electronic module comprises: a multilayer circuit board having a bifurcated area along one edge and a plurality of electronic components mounted on at least one surface; a plurality of electrode pads functionally connected to the electronic components and positioned on the inner surfaces of the bifurcated area so that when the two legs of the bifurcated area are spread apart by about 180° the electrode pads align with respective contacts on a motherboard, and are connectable thereto, so that a secure connection may be created between the circuit board and the motherboard; and, two metal, heat spreading covers lockably enclosing the circuit board, one on either side, the covers further providing mating surfaces upon which a mechanical clamping device can engage and secure the module to a motherboard.

12 Claims, 23 Drawing Sheets

(56) References Cited

U.S. PATENT DOCUMENTS

| | | | |
|---|---|---|---|
| 6,340,896 B2* | 1/2002 | Martin et al. | 324/756.02 |
| 6,472,893 B2* | 10/2002 | Martin et al. | 324/756.02 |
| 6,507,109 B2* | 1/2003 | Kinsman | 257/724 |
| 6,665,190 B2 | 12/2003 | Clayton | |
| 6,800,942 B1* | 10/2004 | Kinsman | 257/777 |
| 7,014,472 B2* | 3/2006 | Fjelstad et al. | 439/65 |
| 7,050,303 B2* | 5/2006 | Park et al. | 361/715 |
| 7,246,431 B2 | 7/2007 | Bang et al. | |
| 7,402,048 B2* | 7/2008 | Meier et al. | 439/65 |
| 7,503,155 B2 | 3/2009 | Meyers | |
| 2004/0100783 A1* | 5/2004 | Amit | 361/796 |
| 2005/0032398 A1* | 2/2005 | Perret et al. | 439/67 |
| 2005/0136703 A1* | 6/2005 | Van Schuylenbergh et al. | 439/67 |
| 2006/0048385 A1 | 3/2006 | Cady et al. | |
| 2006/0049500 A1 | 3/2006 | Goodwin | |
| 2006/0049502 A1 | 3/2006 | Goodwin et al. | |
| 2006/0049512 A1 | 3/2006 | Goodwin | |
| 2006/0049513 A1 | 3/2006 | Goodwin | |
| 2006/0050488 A1 | 3/2006 | Goodwin | |
| 2006/0050489 A1 | 3/2006 | Wehrly et al. | |
| 2006/0050492 A1 | 3/2006 | Goodwin et al. | |
| 2006/0050496 A1 | 3/2006 | Goodwin | |
| 2006/0050497 A1 | 3/2006 | Goodwin | |
| 2006/0050498 A1 | 3/2006 | Cady et al. | |
| 2006/0050592 A1 | 3/2006 | Cady et al. | |
| 2006/0053345 A1 | 3/2006 | Goodwin | |
| 2006/0055024 A1 | 3/2006 | Wehrly | |
| 2007/0211426 A1 | 9/2007 | Clayton et al. | |
| 2007/0211711 A1 | 9/2007 | Clayton et al. | |
| 2007/0212902 A1 | 9/2007 | Clayton et al. | |
| 2007/0212906 A1 | 9/2007 | Clayton et al. | |
| 2007/0212919 A1 | 9/2007 | Clayton et al. | |
| 2007/0212920 A1 | 9/2007 | Clayton et al. | |

* cited by examiner

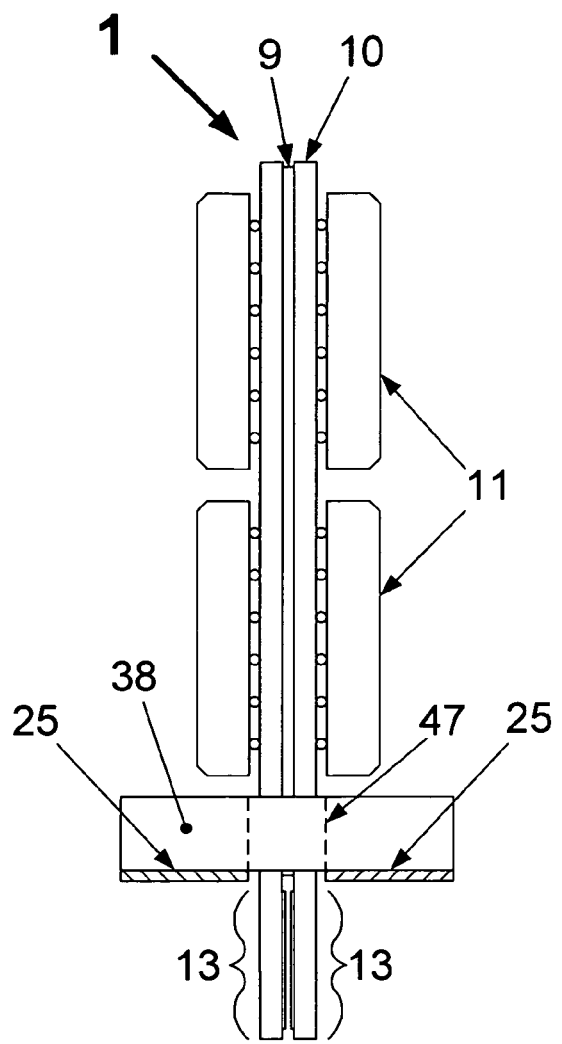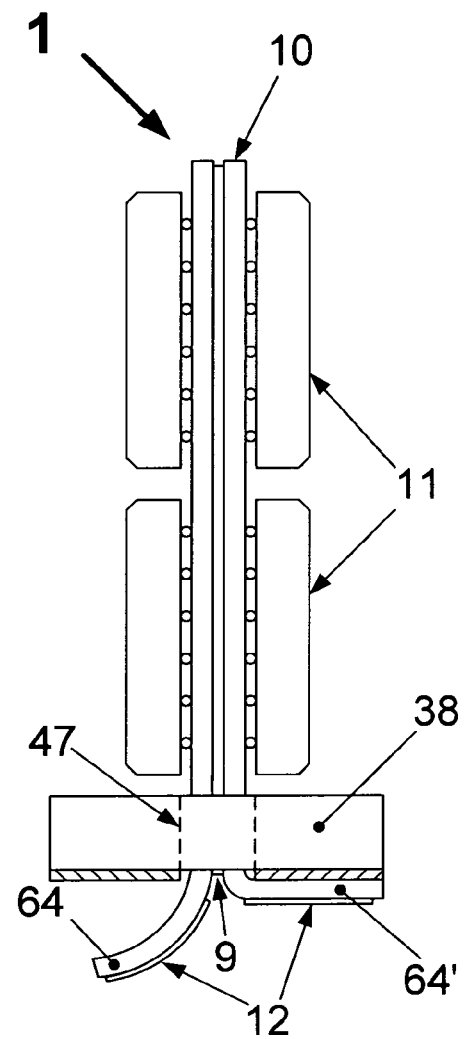
FIG. 11A  FIG. 11B

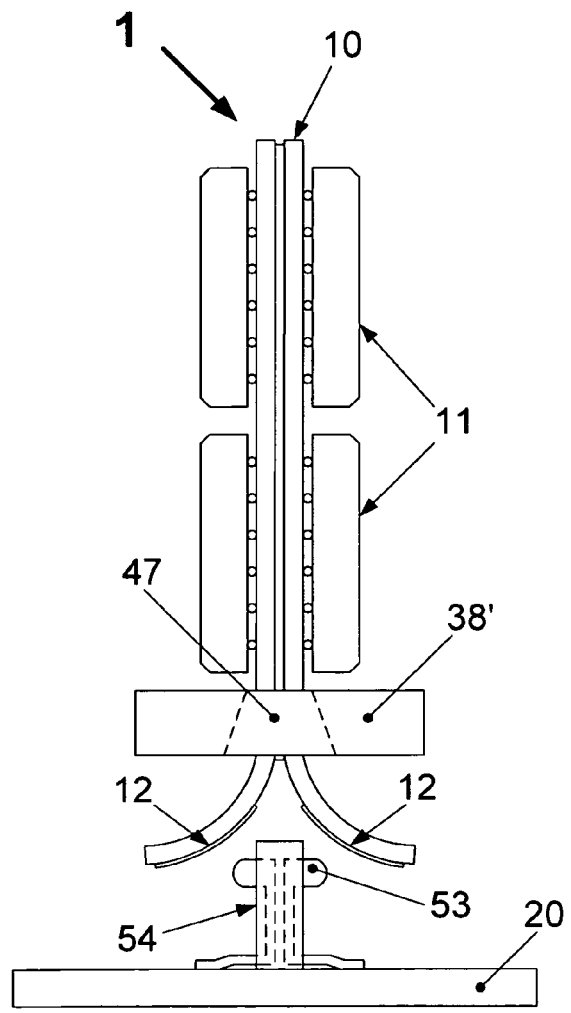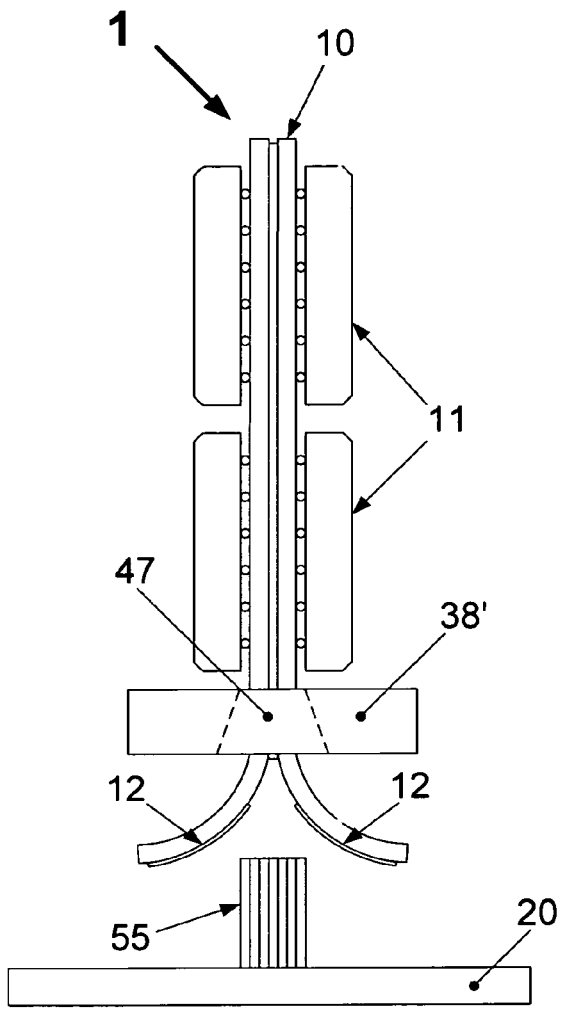

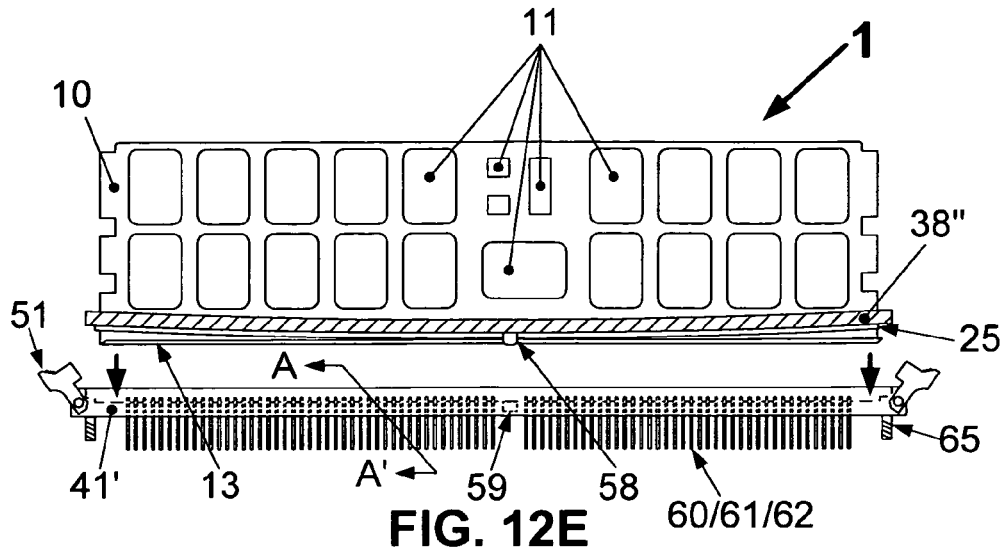
FIG. 12E
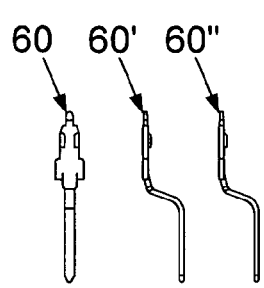
FIG. 12F
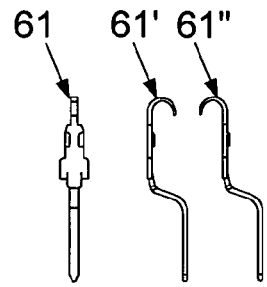
FIG. 12J
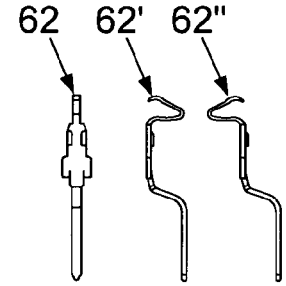
FIG. 12M
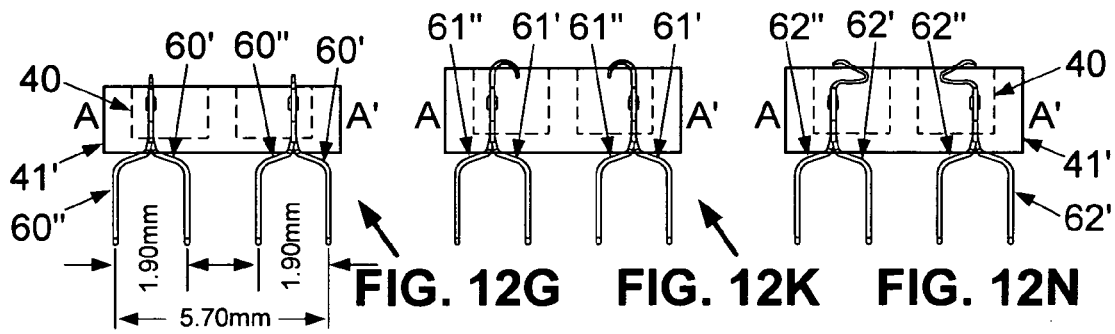
FIG. 12G  FIG. 12K  FIG. 12N
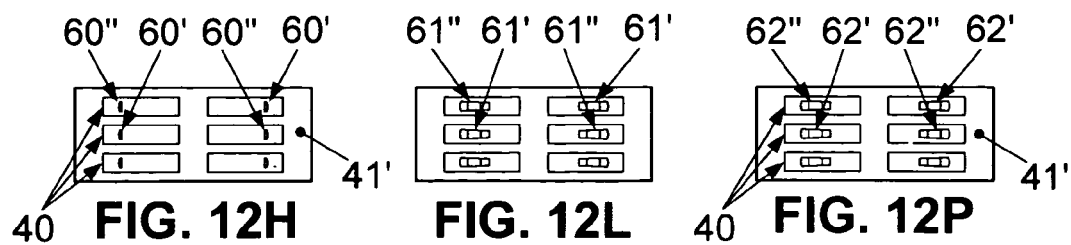
FIG. 12H  FIG. 12L  FIG. 12P

ELECTRONIC MODULE WITH HEAT SPREADING ENCLOSURE

CROSS REFERENCE TO RELATED APPLICATIONS

This application is related to the following U.S. patent applications, filed on even date herewith by the present inventors: Ser. No. 13/573,391, entitled "Flexible circuit board and connection system"; Ser. No. 13/573,976, entitled "Rigid circuit board with flexibly attached module"; Ser. No. 13/573,969, entitled "Method for making an electrical circuit"; Ser. No. 13/573,964 entitled "Electronic interconnect system"; Ser. No. 13/573,964 entitled "Pierced flexible circuit and compression joint"; and Ser. No. 13/573,970 entitled "Compression connector system." The entire disclosures of each of the foregoing are incorporated herein by reference.

BACKGROUND OF THE INVENTION

1. Field of the Invention

The present invention relates generally to means for connecting microelectronic devices and systems. More particularly, the invention relates to improved flex-circuit based interconnect solutions for electronic circuits.

2. Description of Related Art

The evolution of smaller, lighter electronic devices with ever-increasing functionalities has increased the need for packaging, mounting, and interconnection architectures that will reduce size and weight while at the same time preserving interconnection characteristics that can handle the flow of large amounts of data between various circuits or modules in a device. Flex circuits are often used to provide a signal routing means that can be easily located in confined places within an equipment enclosure. They are also used to maintain electrical connections between two components that must move relative to one another; examples are the connections between the motherboard and the display on a laptop computer, or in many cell phones.

Various approaches have been used to enable a long, flexible circuit to be reliably connected to a component such as a motherboard. In one case, a socket is permanently installed on the motherboard (typically by soldering). A mating plug is affixed to the end of the flex by mechanically clamping or crimping; this plug contains internal metal pins that pierce the flex to complete an electrical connection between the lines on the flex and the contacts on the plug that will mate with corresponding contacts on the socket. As the number of lines increases, and the pitch becomes correspondingly smaller, both the cost and reliability of this approach can suffer.

Another approach, used particularly when the flex connection might need to withstand especially demanding mechanical forces, is to affix rigid circuit boards on both sides of the flex near the terminations. These boards typically have plated through holes and can be placed flat against the motherboard to secure a strong soldered connection. Connectors may also be further strengthened by potting in epoxy.

Objects and Advantages

Objects of the present invention include at least the following: providing a flex circuit board and interconnect system having reduced size and complexity; providing a low-cost, highly reliable flex circuit board or module and associated interconnect system; providing a more reliable and manufacturable flex circuit board or module suitable for directly mounting on a motherboard without additional packaging; providing a motherboard with flex circuit boards mounted thereon via a compliant interconnect; and, providing a method for manufacturing flex circuits that is cost effective and suitable for mounting directly on a motherboard without a separate socket.

SUMMARY OF THE INVENTION

In accordance with one aspect of the invention, a flexible circuit board comprises: a multilayer flex circuit having bifurcated extensions along one edge thereof and a plurality of electronic components mounted on at least one surface thereof; and a plurality of electrode pads positioned on the inner and/or outer surfaces of the two legs of the bifurcated extensions such that when the legs are spread apart by about 180° the electrode pads are alignable with respective contacts on a motherboard, and/or on a clamping connector and connectable thereto, so that a secure, mechanically flexible connection may be created between the flexible circuit board and the motherboard.

In accordance with another aspect of the invention, an electrical circuit comprises: a rigid printed circuit board or motherboard having a plurality of electrical contacts on at least one surface thereof: a multilayer flexible circuit board having a plurality of electrical components on at least one surface thereof, and further having a bifurcated area along one edge thereof; electrode pads on the inner surfaces of the bifurcated area of said flexible circuit board that are aligned respectively with electrical contacts on the rigid circuit board when the legs of the bifurcation are spread apart by about 180°; and, electrical connections between the electrode pads and the respective electrical contacts sufficient to maintain electrical continuity and mechanical flexibility between the rigid printed circuit board and the flexible circuit board.

In accordance with another aspect of the invention, a method for making an electrical circuit comprises the steps of:

forming a rigid printed circuit board having a plurality of electrical contacts on at least one surface thereof;

forming a multilayer flexible circuit board having a plurality of electrical components on at least one surface thereof, and further having a bifurcated area along one edge thereof;

forming electrode pads on the inner surfaces of the bifurcated area of the flexible circuit board that are alignable respectively with the electrical contacts on the rigid circuit board when the bifurcated area is spread apart by about 180°;

spreading the bifurcated area apart and aligning the electrode pads respectively with the electrical contacts; and forming an electrical connection between the electrode pads and the electrical contacts.

In accordance with another aspect of the invention, an electronic subsystem comprises: a rigid circuit board daughter card or substrate having a plurality of electrical components on at least one surface thereof and electrical contacts along one edge thereof, one or more flexible circuit leads having a plurality of electrical contacts in electrical communication with the electrical contacts of the rigid printed circuit board thereof, and further extending at an angle along at least one edge thereof; electrode pads on at least one surface of said extension alignable with respective contacts on a motherboard, and/or clamping connector and connectable thereto, so that an electrical and secure, mechanically flexible connection may be created between said rigid circuit board daughter card and said motherboard.

BRIEF DESCRIPTION OF THE DRAWINGS

FIG. 11A illustrates schematically a bifurcated flexible circuit having contact pads on the inner surfaces of bifurcated extensions which are inserted through a slot within a clamping collar, according to one aspect of the invention.

FIG. 11B illustrates schematically a bifurcated flexible circuit having contact pads on the inner surfaces of bifurcated extensions which are inserted through a slot within a clamping collar and partially or fully reflexed against the bottom surface thereof, according to one aspect of the invention.

FIG. 11C illustrates schematically a bifurcated flexible circuit having contact pads on the inner surfaces of partially reflexed bifurcated extensions which are inserted through a slot within a clamping collar for attachment to a test socket, according to one aspect of the invention.

FIG. 11D illustrates schematically a bifurcated flexible circuit having contact pads on the inner surfaces of partially reflexed bifurcated extensions which are inserted through a slot within a clamping collar for attachment to a Zebra Strip Connector, according to one aspect of the invention.

FIG. 12E illustrates schematically the side-view of a bifurcated flexible circuit inserted through a slot of a bowed clamping collar for attachment to a compression latch with integral, press-fitted, stamped metal contacts, according to one aspect of the invention.

FIG. 12F illustrates schematically the front and side-views of stamped metal straight contacts, according to one aspect of the invention.

FIG. 12G illustrates schematically a cross-section view of staggered, stamped metal straight contacts press-fitted into a compression latch assembly, according to one aspect of the invention.

FIG. 12H illustrates schematically a top-view of staggered, stamped metal straight contacts press-fitted into a compression latch assembly, according to one aspect of the invention.

FIG. 12J illustrates schematically the front and side-views of stamped metal "J-bend" contacts, according to one aspect of the invention.

FIG. 12K illustrates schematically a cross-section view of staggered, stamped metal "J-bend" contacts press-fitted into a compression latch assembly, according to one aspect of the invention.

FIG. 12L illustrates schematically a top-view of staggered, stamped metal "J-bend" contacts press-fitted into a compression latch assembly, according to one aspect of the invention.

FIG. 12M illustrates schematically the front and side-views of stamped metal spring contacts, according to one aspect of the invention.

FIG. 12N illustrates schematically a cross-section view of staggered stamped metal spring contacts press-fitted into a compression latch assembly, according to one aspect of the invention.

FIG. 12P illustrates schematically a top-view of staggered, stamped metal spring contacts press-fitted into a compression latch assembly, according to one aspect of the invention.

DETAILED DESCRIPTION OF THE INVENTION

The concept of a bifurcated flex circuit board is taught Applicants' U.S. patent application Ser. No. 12/317,757, as well as in Applicants' issued U.S. Pat. Nos. 7,796,399, and 7,724,530. The entire contents of all of the foregoing are incorporated herein by reference. The aforementioned disclosures are directed to various ways of making rigid modules, particularly DRAM modules, for rigidly mounting onto a motherboard via a rigidly-mounted socket or by soldering or adhesive bonding directly onto contacts on the motherboard The present invention is based on Applicants' recognition that a multilayer, bifurcated flex circuit board can be mounted directly onto a motherboard in such a way that the mounting is flexible (i.e., it can allow the flex circuit to bend from side to side to some degree) and yet maintains electrical connectivity to the motherboard. As will be illustrated in the following examples, this structure provides numerous surprising advantages over conventional rigidly-mounted electronic modules. Some of these advantages include the following: 1. Size, weight, and cost of the entire system can be reduced by eliminating much of the module-level packaging. 2. Heat-generating components may be more effectively cooled by eliminating layers of packaging' including surrounding socket structures which may impede air flow along the modules. 3. Assembly methods can take advantage of the compliant mounting of subsystems, allowing them to be folded sideways to reduce the height of the populated motherboard.

Figure 1:
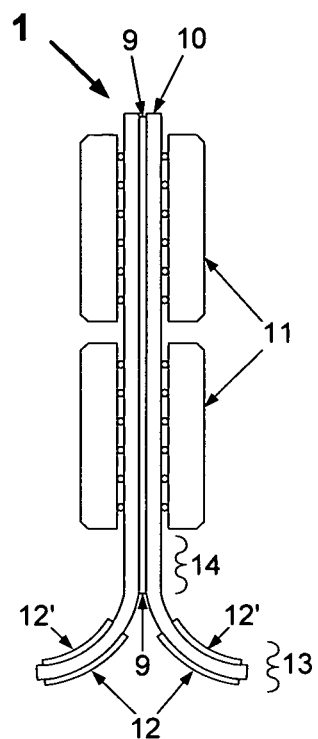
FIG. 1 illustrates schematically a bifurcated flexible circuit having contact pads on the inner and outer surfaces of bifurcated extensions according to one aspect of the invention.
Figure 2:
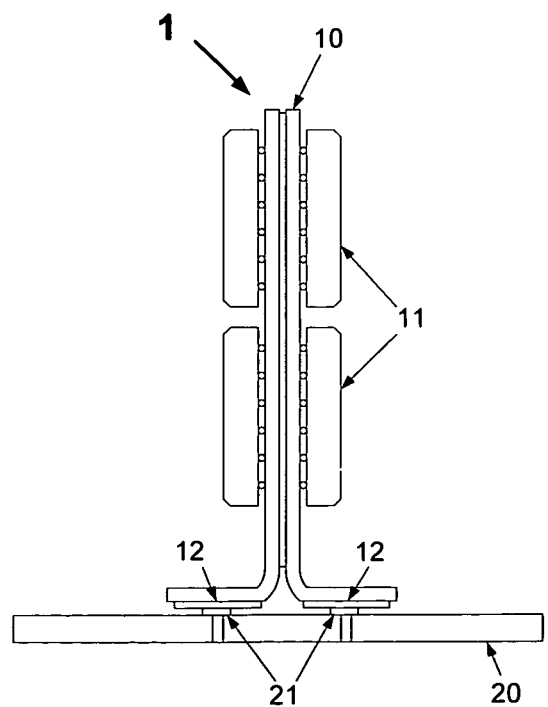
FIG. 2 illustrates schematically a bifurcated flex circuit direct-mounted on a printed circuit board or motherboard.
Figure 3A:
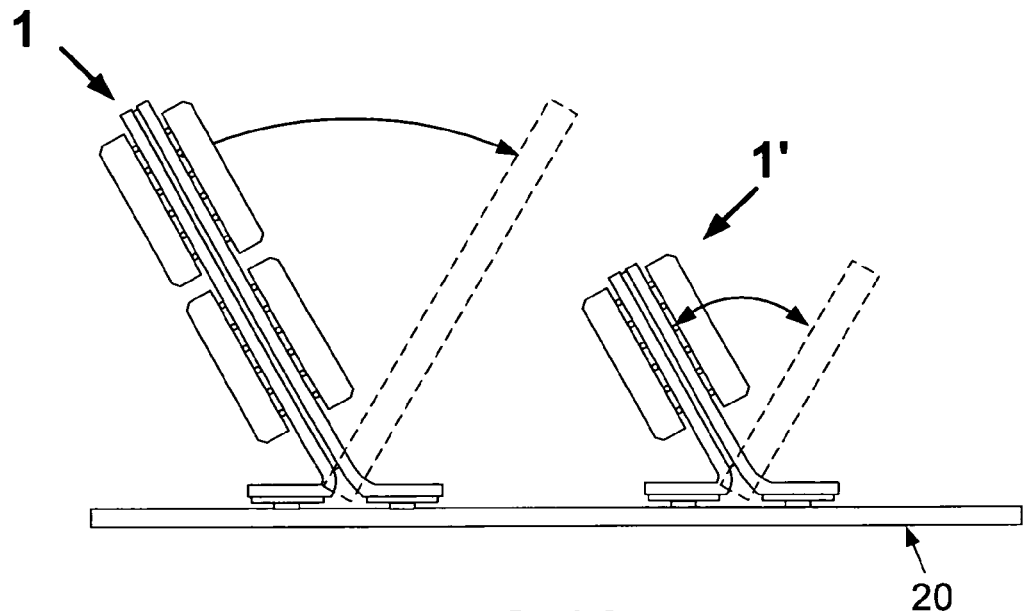
FIG. 3A illustrates the flexible or compliant properties of bifurcated flexible circuits direct-mounted on a motherboard according to another aspect of the invention.

FIGS. 1-3 illustrate electronic subsystems 1, 1' and 1" in which a centrally located, multilayer, bifurcated flexible circuit board or substrate 10 is populated on one or both sides with various electronic components 11, which are connected by vias to circuit lines or traces on the inner and external surfaces of the individual dielectric plies. In the examples shown, two individual plies, with circuit traces on both surfaces, are bonded or laminated together with an adhesive or film 9 at the middle of the sandwich and interconnected with vias. Along one edge, the two flexible plies are bifurcated into two extensions or legs 13 by either selective application or removal of the middle bonding adhesive or by peeling the edges apart if the laminate plies are weakly bonded. In this example, electrode pads 12 are arranged along the inner surfaces of the bifurcated extension and electrode pads 12' are arranged along the outer surfaces of the two bifurcated legs. Spreading the two legs of the bifurcated area apart, typically by about 180°, exposes pads 12 and enables them to be aligned with respective contacts 21 on a rigid printed circuit board or motherboard 20 as shown in FIG. 2. The pads are then bonded to the contacts using solder, anisotropic conductive adhesive, or isotropic conductive adhesive, or by clamping them in compression against the contacts, thereby functionally connecting the subsystem 1 to the motherboard. At the same time, there is a sufficient length of the legs 13 of the bifurcated flexible circuit board to allow the flex board to move from side to side by a useful amount. (As used herein, a useful amount of flexure might be as little as a few degrees or as much as +/−45° or even 90°, as shown generally in FIG. 3.)

It will be appreciated that as used herein, the term "motherboard" is not limited specifically to a circuit board that includes a computer's CPU, but instead simply refers to any substantially rigid printed circuit board on which various components and subsystems may be mounted to form a higher-level electronic system. It will be further appreciated that the invention may be applied to desktop computers, mobile computers, tablet computers, smart phones, servers, and virtually any electronic system in which one needs to attach a multi-component subsystem to a larger system.

EXAMPLE

FIG. 1 illustrates schematically a bifurcated flexible circuit board 10. The board may be constructed by forming two individual flexible dielectric sheets using polyimide or other suitable substrate material having selected metallization patterns as are well known in the art. Each sheet has electronic components 11 mounted on one side (which for clarity will be referred to as the outer surface) and a metallization pattern, including electrode pads 12 on the other side. Each sheet will typically have conductive vias that interconnect the two sides of the sheet, thereby allowing signals to move between the components 11 and pads 12.

In one embodiment of FIG. 1, the bifurcated flexible circuit board 10 consists of an Organic Light Emitting Diode display (OLED) adapted for direct connection to a PCB or motherboard 20 as explained below.

The two sheets are bonded together with an adhesive film 9 over most of their surface area, leaving a bifurcated area forming two extensions 13 along one edge. The flexible board will also preferably extend for some distance between the mounted components 11 and the extensions 13 to create a compliant region 14.

EXAMPLE

FIG. 2. illustrates a subsystem 1 mounted onto motherboard 20. Contacts 21 on motherboard 20 are spaced so that they will align with their respective electrode pads 12 on the flex board of subsystem 1. Alignment holes may be located near the center and/or ends of the length of the bifurcated extensions or legs 13, as shown at 57 in FIG. 12C, to aid in the alignment of the electrode pads 12 with the contacts 21 on the motherboard. When pads 12 are bonded or compressed against contacts 21, the subsystem 1 is securely attached to motherboard 20, and yet has a degree of flexibility as shown schematically in FIG. 3A. It will be appreciated that if pads 12' are disposed on the outer surfaces of the legs 13 as shown in FIG. 1, another mounting option is available (not shown): In this option, the motherboard can have a slot through which compliant region 14 is passed. Legs 13 are then opened to bring pads 12' into alignment with contacts on the underside of motherboard 20.

The contact pads on the motherboard of FIG. 2 may be either of the Surface Mount Technology (SMT) type or through-hole type, as illustrated.

EXAMPLE

Figure 3B:
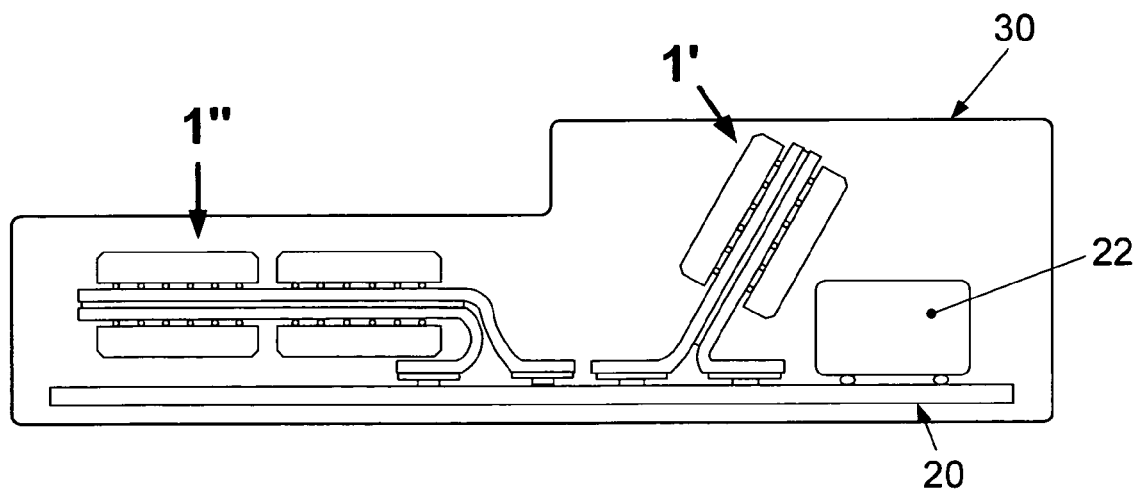
FIG. 3B illustrates the flexible or compliant properties of bifurcated flexible circuits direct-mounted on a motherboard within an enclosure according to another aspect of the invention.

The inherent flexibility of the inventive interconnection system provides the system designer with many opportunities to optimize system-level layout and assembly as shown in FIG. 3B. Here, motherboard 20, having two subsystems 1' and 1" and another component 22 mounted thereon, must be packaged into housing 30. After bonding to motherboard 20, subsystem 1' is flexed clockwise by about 45° and subsystem 1" is flexed counterclockwise by about 90° to accommodate the geometrical constraints imposed by the system requirements. For applications requiring subsystems 1" to be flexed up to 90° the adhesive or bonding film 9 used to laminated the flexible layers of plies together may be adjusted to lengthen the bifurcated area and legs 13, as shown in FIG. 3B.

EXAMPLE

The electronic components 11 mounted on the flex board may be of any type, such as, for example, logic devices and microprocessors, memory chips including DRAM or flash, buffer and timing circuits, analog, digital, and mixed-signal circuits, RF devices, optoelectronic devices including LEDs, and passive components including resistors, capacitors, inductors, and antennas. Furthermore, components 11 may be of any suitable size or form, such as, for example, bare die, packaged die, surface-mount, BGA, multichip module, etc., and the components may be attached to the flex board using any conventional technique such as solder, epoxy and wire bonds, or various conductive adhesives as are well known in the art.

EXAMPLE

Figure 4A:
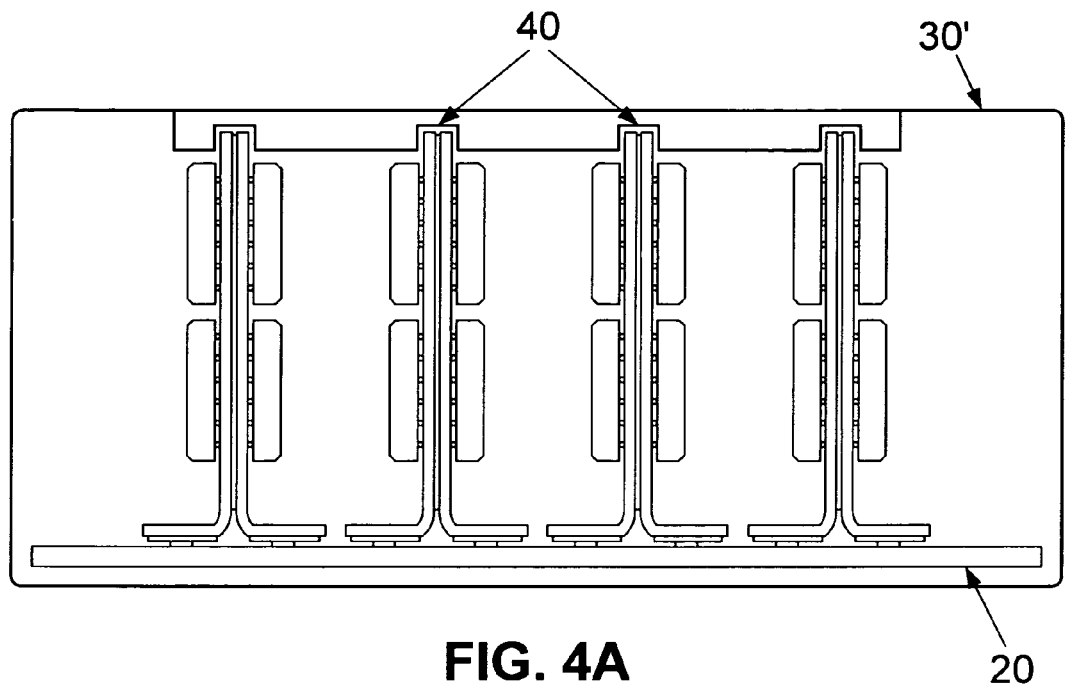
FIG. 4A illustrates a supporting device to prevent excessive flexure between bifurcated flexible circuits that are vertically mounted on a motherboard according to another aspect of the invention.
Figure 4B:
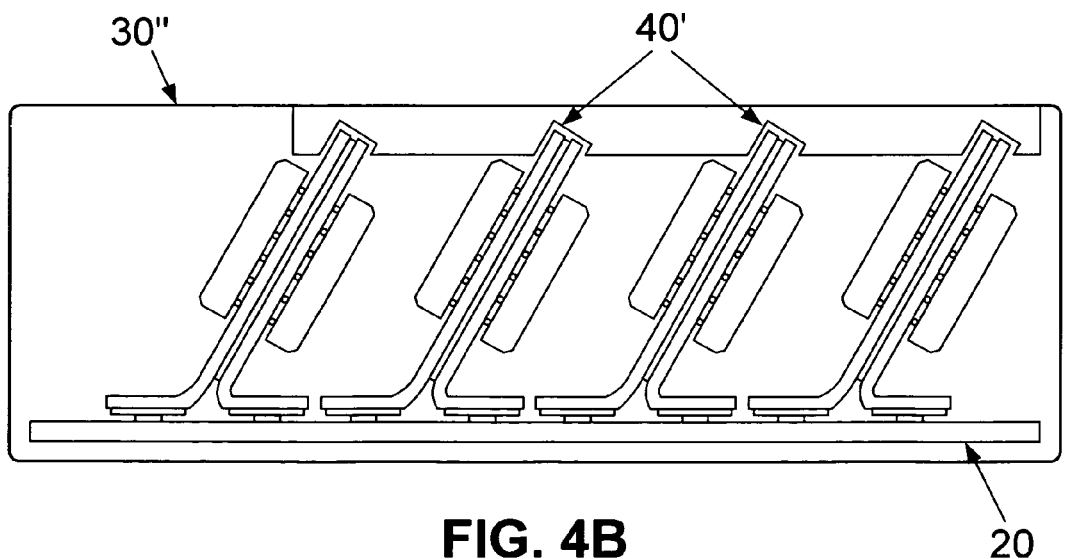
FIG. 4B illustrates a supporting device to prevent excessive flexure between bifurcated flexible circuits that are mounted at an oblique angle to a motherboard according to another aspect of the invention.

The invention may be used for mounting one or more rows of DRAM chips onto a motherboard, where a key advantage of the invention is that the individual chips are more easily cooled by flowing air because much of the traditional package requirements of a conventional DRAM module is reduced or eliminated (e.g. module width/height or socket obstruction). It will be appreciated, however, that when a large flow of coolant is expected, it will in some cases be desirable to constrain the flexure of the subsystem 1 relative to the motherboard 20 so that unconstrained harmonic oscillations won't lead to fatigue and premature mechanical failure of the interconnects. FIG. 4A illustrates an enclosure 30' having slots 40 along the top inner surface. Slots or other mechanical constraint structures may alternatively be attached to motherboard 20 instead of to enclosure 30'.

EXAMPLE

As noted earlier, in some cases, it is desirable to orient the subsystem 1 at some angle relative to motherboard 20 in order to reduce the system profile as shown generally in FIG. 3B. In these situations, if flowing coolant is also used, a reduced-height enclosure 30" may employ angled slots 40' to hold the flex boards at a selected angle relative to motherboard 20. A solution of this type might be appropriate for applications such as blade servers, for example.

Those skilled in the art will appreciate that the invention is not limited to particular applications such as DRAM, but in fact is a general solution to many electronic systems and interconnection problems.

EXAMPLE

The inventive circuit is preferably manufactured as follows. First, two individual flexible circuit plies or laminates having conductive traces (typically on both surfaces) and vias connecting one surface to the other and one ply to another as needed, are formed by conventional means and bonded together over most of their surface area to form a multilayer flex panel or circuit board, leaving an unbonded strip (bifurcation) along one edge. The electrode pads intended to connect this circuit to a motherboard are located on the inner surfaces of the bifurcation. Next, the flex circuit is populated by microelectronic devices, which may be any combination of analog, digital, or mixed-mode semiconductor devices or passive components. This step will typically involve conventional "pick and place" assembly using solder or conductive adhesives as are known in the art. Then, the two legs of the bifurcated extensions or area are spread apart and the electrode pads are aligned with rows of contacts on a motherboard. The pads on the flex are then joined to the contacts using solder or conductive adhesive, by which the flex is securely held onto the motherboard but still able to bend from side to side by an amount that will be controlled to some degree by the rigidity of the flex and its overall geometry.

Applicants contemplate that for some applications, a soldering bonding technique will be used to affix the flex circuit to the rigid circuit board. Alternatively, adhesive bonding using isotropic or anisotropic conductive adhesives may also be used as is well known in the art of electronic assembly. Each of the above mentioned techniques result in a permanent or semi-permanent mating of the flex circuit to the rigid circuit board or motherboard. In other cases, however, a detachable mating of the aligned pads and contacts will be the preferred method and various clamping devices, collars and compression latch assemblies are disclosed for this purpose. A variety of novel clamping devices are also disclosed herein to enable the flexible extensions to be temporarily, or semi-permanently compressed against various pads, plated through-holes, pins, compressible springs or conductors, and interposers.

Figure 5:
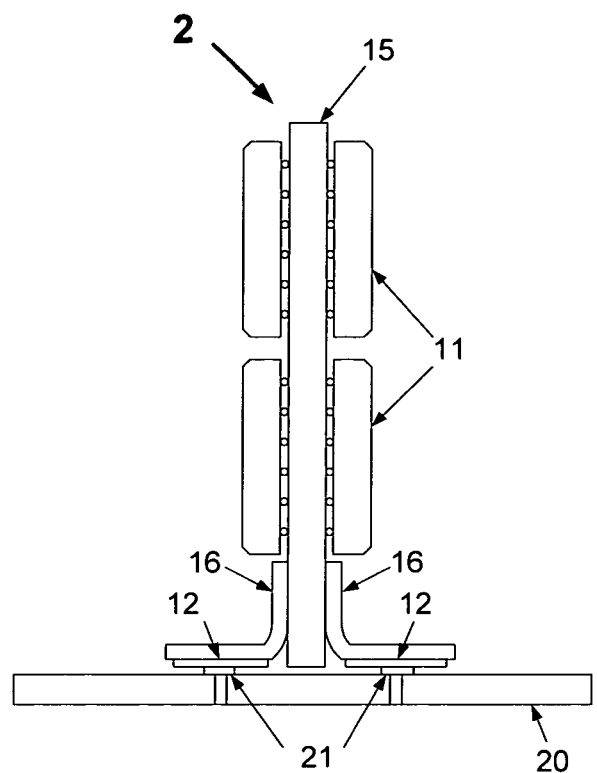
FIG. 5 illustrates schematically a rigid printed circuit board adapted with flexible circuit leads having contact pads on the inner surfaces for direct-mounting on a printed circuit board or motherboard according to one aspect of the invention.

The invention may also be modified to use with rigid circuit boards. Referring now to FIG. 5, an electronic subsystem 2, with a rigid circuit board or substrate 15 in place of a flexible circuit, is illustrated in cross-section with four rows of electronic components 11 in a standard-height DIMM memory module. In order to adapt the rigid circuit board for direct connection to the motherboard 20, flexible circuit leads 16 are electrically and mechanically attached to the DIMM pads along the bottom sides and spread apart to about 180° to enable electrode pads 12 to connect to contacts 21 on the PCB or motherboard 20. In this manner, a rigid printed circuit board module can be adapted for mounting at various angles with the respect to the motherboard as previously described in FIG. 3A.

In an alternative embodiment of FIG. 5, the rigid circuit board or substrate 15 consists of a Liquid Crystal Display (LCD) adapted for direct mounting to a PCB or motherboard 20 using bifurcated flexible circuit leads. In another alternative embodiment of FIG. 5, the rigid circuit board or substrate 15 consists of a Rigid-Flex Circuit Board adapted for direct mounting to a PCB or motherboard 20 using bifurcated flexible circuit leads.

Figure 6:
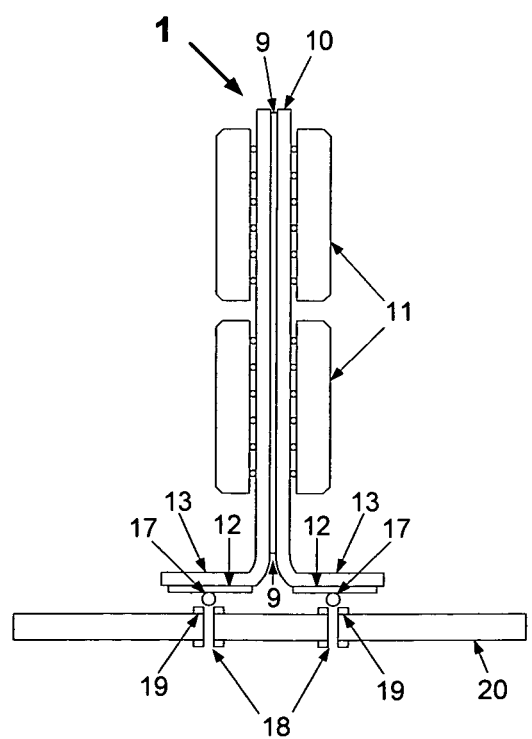
FIG. 6 illustrates schematically a bifurcated flex circuit direct-mounted on a printed circuit board or motherboard by means of conductive spheres or bumps, according to another aspect of the invention.

FIG. 6 illustrates a design for enabling electronic subsystem 1, with a birfurcated flexible circuit board or substrate 10, to be directly mated to a motherboard 20. Electrode pads 12, arrayed along the bottom, inside surfaces of the birfurcated area are exposed when legs 13 are bent apart in such a manner to form a 180° angle to mate with motherboard 20. The angle illustrated here between each leg 13 and flexible circuit board 10 is approximately 90°; however, other angles may likewise be implemented. In this example, an array of conductive spheres or bumps 17 are disposed on electrode pads 12 to enable the pads to self-align and electrically mate with appropriately sized annular rings 19 of plated-through holes (PTHs) 18 arrayed on the motherboard 20. Conductive spheres or bumps 17 may be fashioned from a large variety of materials, including; plated or partially reflowed solder balls, plated metal columnar bumps, gold thermo-compression bonded balls or stud bumps, stenciled or dispensed conductive epoxy or conductive elastomeric material, or anisotropic conductive adhesive and other means known for establishing electrical connection between flex circuit electrode pads 12 and PTH annular rings 19 or contacts 21 (not shown) of motherboard 20. Conductive spheres made using solder alloys enable the electrode pads to be directly soldered to either the pads or plated-through holes of the motherboard. For example, if the flex circuit pads are simply coated with solder by plating or dipping in a molten bath, or if solder paste is stenciled or dispensed onto the motherboard contacts, the pads and contacts can then be subsequently soldered together by aligning them and using a heater-bar to simultaneously compress and melt the solder. Alternatively, if the conductive spheres are fashioned from either a rigid or compressible conductive material, they may be removably mated to the motherboard contacts using various means for applying a clamping force between the two surfaces.

Figure 7:
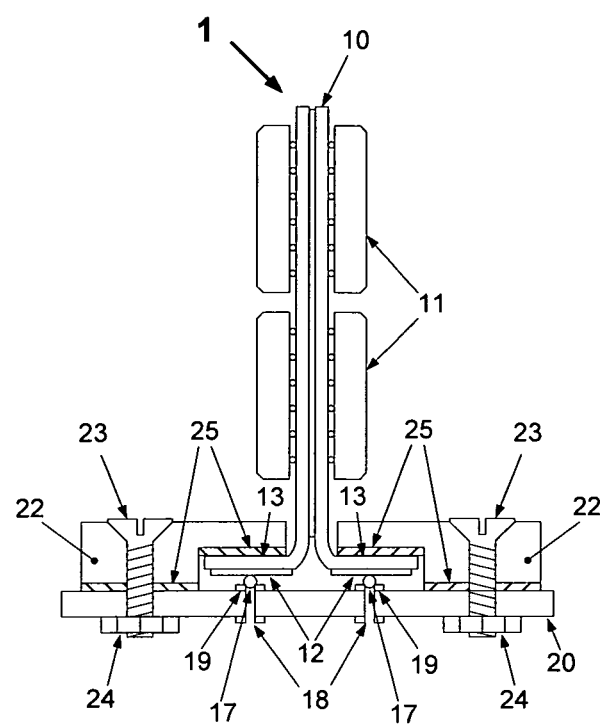
FIG. 7 illustrates schematically a bifurcated flex circuit direct-mounted on a printed circuit board or motherboard by means of compression clamps, according to another aspect of the invention.

In many instances it will be preferable for electronics subsystem(s) 1 to be removably mounted to the motherboard 20. FIG. 7 illustrates an example of a clamping device 22 for applying a compressive force against the backside of the bifurcated extensions 13 to establish electrical contact between the PTH annular rings 19 and conductive spheres 17 on electrode pads 12 fashioned from plated metal bumps. Conductive spheres 17 are designed with a diameter slightly larger than the inside diameter of the PTH vias 18 such that when a compressive force is applied the plated metal conductive spheres 17 enter into intimate, gas tight, electrical contact with the inside perimeter of the PTH annular rings 19. This electrical contact is maintained as long as the compressive force is maintained. Conversely, when the compressive force maintaining the electrical connection is removed, electronic devices or electronic subsystems 1 can be removed from the motherboard without need of a de-soldering process. Compressive force in FIG. 7 is provided using a screw 23 and a lock nut 24 to apply a clamping force against the backside of the bifurcated extensions 13. The plated metal conductive spheres 17 are positioned on electrode pads 12 to align and mate with the inside perimeter of the PTH annular rings 19 typically used for receiving and soldering the DIMM socket's pins. These sockets typically require four adjacent rows of staggered PTH vias 18 on the motherboard that receive the socket pins for soldering. The plated metal conductive spheres align with each via of the motherboard in a similar staggered configuration. For purposes of this compression contact, it is preferable that both the conductive spheres and PTH vias are plated with gold or other noble metal to ensure reliable electrical conductivity. Normal force is applied and maintained to these plated bumps using a clamping device 22. One simple clamping device would consist of a metal bracket with a compliant material 25 on the bottom surfaces that is compressed against the surface of the motherboard 20 and flexible circuit extensions 13. The compliant material 25 may be composed of rubber, silicone, or other material with elastomeric properties, which can be bonded to the surface of the metal clamping device. As noted earlier, other materials can be substituted for the plated metal conductive spheres 17, such as a "Zebra Strip" (i.e., conductive elastomeric material), for achieving electrical connection when compressed between electrode pads 12 and PTH annular rings 19.

Figure 8A:
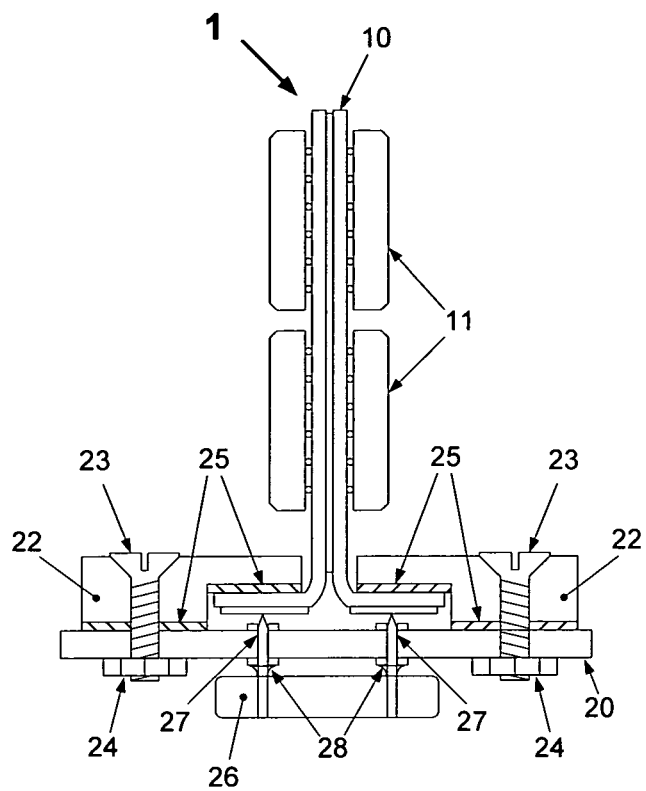
FIG. 8A illustrates schematically a bifurcated flex circuit direct-mounted on protruding pins, soldered to a printed circuit board or motherboard, by means of compression clamps, according to another aspect of the invention.

FIG. 8A is similar to FIG. 7, but illustrates a different contact technique for the electronic subassembly 1. In this embodiment, conductive spheres 17 are replaced with a "bed-of-nails" connector 26 that includes an array of pins extending from the bottom of motherboard 20, through the PTH vias 18, and projecting slightly above the PTH annular rings 19.

Connector 26 includes a molded plastic "rail" to hold the pins in proper alignment for simultaneous insertion into the motherboard vias and to set the correct stand-off height of the pins above the PTH annular rings. For this application the protruding pins 27 would preferably be made of stamped metal with pointed or blunt tips that are selectively gold plated and soldered from the bottom to form solder fillets 28 around the shaft of each pin and bottom annular rings if the PTH vias. The compliant material 25, opposite the electrode pads of the bifurcated extensions, helps the pads to conform to the shape of the protruding pins and compensates for any non-uniformity in the height of the pins. Once the pins 27 are soldered to the motherboard, the plastic rail may optionally be removed. If the pins are wave soldered from the bottom side of the mother board, the solder would typically form solder fillets 28, as shown. The advantage of this connector concept is that the electrical signal path from the motherboard into the sub-assembly is kept to a minimum distance and should therefore exhibit less parasitic capacitance and/or inductance with higher signal speeds. Although only two rows of connector pins are illustrated in cross-section for FIG. 8, it should be understood that there would preferably be four rows of staggered protruding pins 27 that match the mounting footprint of standard 240-pin DIMM memory module sockets as viewed from above the motherboard.

In recent years there has been an increasing recognition for the need to increase the number of contact pins or pads on high-density, high-speed, memory modules to provide more power and ground connections to the modules. The additional power/ground connections aid in balancing the power and ground requirements for higher speed memory components and in providing better signal integrity of input/output signals. Normally this would be achieved by reducing the pad-to-pad pitch on the modules and correspondingly increasing the number of socket pins which contact these module pads. But, the number of contact pins on traditional DIMM sockets seems to have reached a practical limit at its current level of 240 pins due to the excessive insertion and extraction forces required. Many OEM manufacturers are experiencing problems with module and socket breakage during insertion of the modules and the problem is exacerbated if automated equipment is used for this manufacturing step. The embodiment shown in FIG. 8B is an attempt to help solve this problem.

Figure 8B:
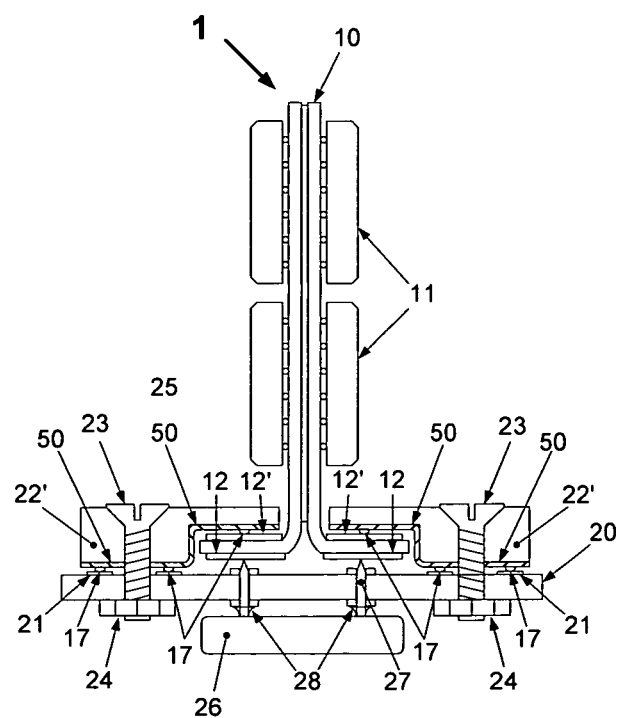
FIG. 8B illustrates schematically a bifurcated flex circuit direct-mounted on protruding pins, soldered to a printed circuit board or motherboard, by means of compression clamps that include flex circuit connectors, according to another aspect of the invention.

The electronic subsystem 1 and "bed-of-nails" connector 26, as shown in FIG. 8A, are similar to FIG. 8B, but the bifurcations now include both bottom electrode pads 12 and top electrode pads 12', similar to FIG. 1, and clamping device 22' is modified to include an integrated flex circuit connector 50 with integrated conductive spheres or bumps 17. The flex connectors 50 with conductive bumps 17 are clamped and held in compression against top electrode pads 12' and contacts 21 on the motherboard 20 while simultaneously pressing the bottom electrode pads 12 against the protruding pins 27. Flex connectors 50 also include circuit traces that are routed between the conductive bumps 17 which simultaneously contact the top electrode pads 12' and PCB contacts 21. This configuration effectively doubles the number of input/output contacts for electronic subsystem 1 without requiring a significant increase in the amount of compressive normal forces. It should be noted, however, that a similar increase in the number of input/output contacts can be achieved for the embodiments represented in FIGS. 7 and 8A by simply reducing the pad-to-pad pitch of electrode pads 12 and PTH vias 19 without requiring a significant increase in the amount of compressive normal forces.

Figure 9:
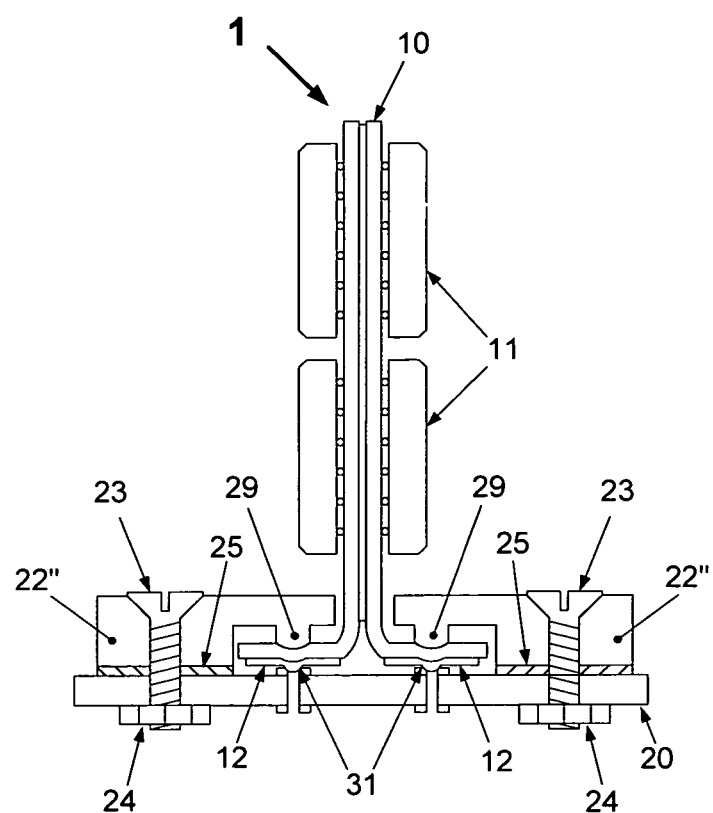
FIG. 9 illustrates schematically a bifurcated flex circuit direct-mounted to a printed circuit board or motherboard, by means of compression clamps that include integral compression posts, according to another aspect of the invention.

Turning now to FIG. 9, another configuration 22" of the clamping device is illustrated. This clamping device integrates compression posts 29 opposite each electrode pad on the bifurcations to selectively deform the electrode pads 12 in a manner that causes them to protrude into the apertures of the PTH vias and against the interior edges of the PTH annular rings. The resulting formed electrode pads 31 and compressive posts 29 are engineered to provide reliable electrical connections by providing constant contact force between pads 12 and the PCB or motherboard vias during temperature cycling of the components. Since the posts will require constant force against the pads, it is preferable that they be fashioned from metal or a rigid plastic. It will be appreciated that the deformation process is aided by the thin cross-sectional thickness and inherently deformable characteristics of the bifurcations. However, additional modifications to the electrode pads 12 on the bifurcations, as represented in FIGS. 10A-C, can improve and assist in the deformation of the formed electrode pads 31 to better engage the PTH on the motherboard 20.

Figure 10A:
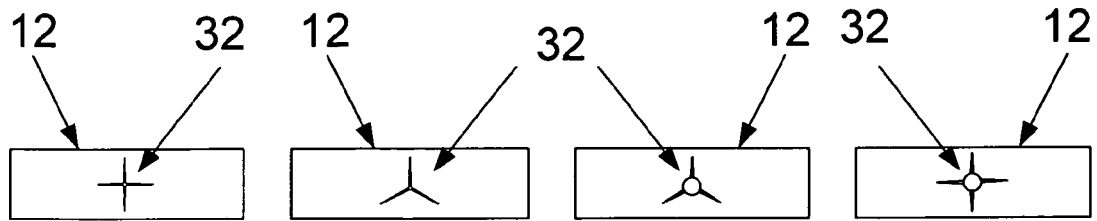
FIG. 10A illustrates different patterns for piercing the electrode pads on the bifurcated extensions, according to one aspect of the invention.
Figure 10B:
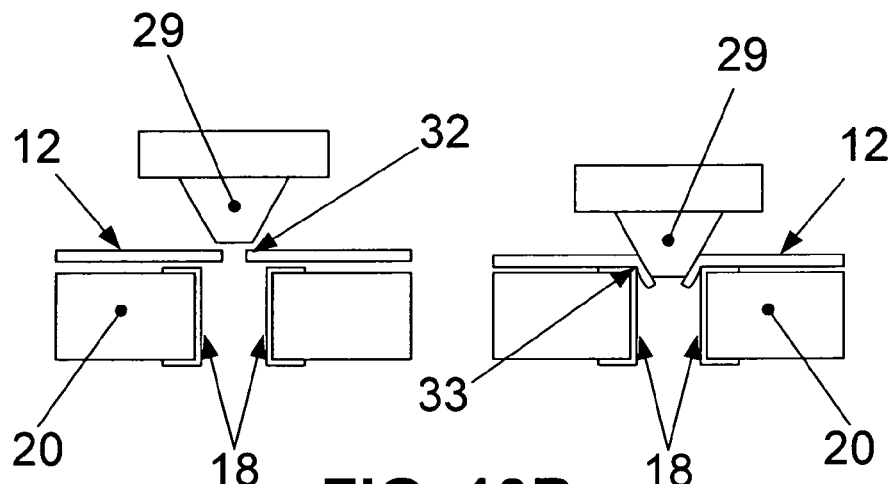
FIG. 10B illustrates in cross-section the deformation of a pierced electrode pad when compressed by a post, according to one aspect of the invention.

FIG. 10A illustrates a single electrode pad 12, as viewed from above the pad, with four examples of various slitting patterns or shapes to produce a pierced electrode pad 32. From left-to-right the patterns have either four or three slits with and without a center aperture. The slits would extend through the entire cross-sectional thickness of the electrode pad 12, and allow a compression post 29 to more easily deform each slotted portion of the electrode pad 33 to conform with the interior aperture of each PTH via 18 as represented in FIG. 10B. Referring then to FIG. 10B, an enlarged cross-sectional view of the PTH via 18, electrode pad 12, pierced electrode pad 32, and compression post 29 is illustrated. The figure on the left illustrates a view of the mating surfaces before the compression post engages with the pierced electrode pad, while the illustration to the right shows the mated surfaces after the post presses the pierced electrode pad down into the PTH via 18 and spreads and compresses the slotted portions of the electrode pad 33 against the interior edges of the PTH aperture ring. The inventive slits or other piercing features will help the flex conform to a dimpled surface in either a convex or concave direction.

Figure 10C:
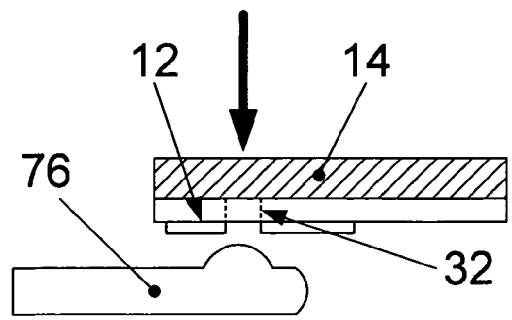
FIG. 10C illustrates in cross-section a pierced electrode pad adjacent a layer of compliant material that enables a controlled deformation of the pad when a force is applied against a contact pin.

FIG. 10C shows another cross-section example of pierced electrode pad 32 with a compliant material 25 placed on the opposite surface of the flexible circuit. When a force is applied from above, as illustrated by the bold arrow, the compliant material will allow the pads 12 to deform in a controlled manner against a metal contact pin 76, similar to that as shown at 33 in FIG. 10B.

Applicants contemplate the principles described above for FIGS. 10A-C can be applied in general to other interconnect applications involving flexible circuits, including the examples illustrated in FIGS. 12E-H, FIGS. 17A-B and FIGS. 18A-D. The principles described above allow flexible circuit connectors or sockets to be fashioned without the necessity for using piercing pins, thereby reducing cost, enabling lower profile connections and adding electrical redundancy.

In the preceding "removable" electronic subsystems of FIGS. 7, 8A-B, and 9, the clamping devices rely on threaded screws 23 and lock nuts 24 positioned to the sides of the devices to apply the required compressive normal forces to achieve electrical contact between the bifurcated electrode pads and PTH annular rings or vias of the motherboard. The extended portions of the clamping devices that hold these screws and lock nuts reduce the available mounting area on the motherboard for other adjacent subsystems such as parallel banks of memory modules. Ideally, manufacturers prefer to reduce the amount of space or pitch between components in order to increase the functionality of the motherboard for a given fixed board size or enclosure. Since memory requires a significant amount of the available space on most motherboards, it is highly desirable to place the individual memory modules as close as practical without impeding the air circulation or ability to insert and remove the modules from the DIMM sockets pre-soldered on the motherboard. Accordingly, a novel clamping collar 38 is integrated with the bifurcations 13 for the electronic subsystems illustrated in FIGS. 11A-D, 12A, and 12E to simplify the mounting/unmounting and reduce the width necessary for clamping the removable modules to the motherboard.

Turning now to FIG. 11A, a cross-section view is illustrated of an electrical subsystem 1, similar to FIG. 1, with a multilayer flexible circuit 10, four rows of components 11 and bifurcations 13. Surrounding the compliant region 14 (refer to FIG. 1) of the bifurcated leads is a clamping collar 38 with an open slot 47 along the centerline of the collar that allows the extensions to be inserted through the collar. The collar is preferably metal or a rigid molded plastic suitable for transferring the compression forces along its lateral length. On the bottom of the collar is a layer of compliant adhesive material 25 for bonding the bifurcations 13 to the bottom surface of the collar when they are spread apart (FIG. 11B). The resulting integrated clamping collar enables the electronic subsystem or module to be mated directly with the pads or PTH vias on the motherboard, as shown in FIG. 12A-B, or to a variety of socket pins or springs, as shown in FIG. 12E-P.

Another novel clamping collar 38' is illustrated in FIG. 11C. The collar includes an open slot 47' that is tapered towards the top and sized to mate with a narrow contact post 54, the bottom leads of which are surface mount soldered to the motherboard 20. The clamping collar 38' is designed to apply a lateral, inward clamping pressure against both flexible legs of the bifurcation when the collar 38' is pressed downward and over the contact post. When fully seated, the clamping collar locks the leads to the post and pinches the electrode pads 12 against the protruding spring pins 53 of the contact post 54. One particular problem is resolved with this type of connector system. After components 11 are assembled to the flexible bifurcated circuit 10, it is highly desirable to perform an electrical functional test of the components and assembly connections prior to proceeding to the next assembly steps. However, electrode pads 12 are typically disposed on the inner surfaces of the flexible plies making test probe access difficult. The clamping collar and contact post, as described above, therefore serve, among other things, as a novel solution to simplify electrical testing of electronic subsystems 1 or unpopulated, bare, bifurcated flexible circuits 10 prior to component attachment. In addition, clamping collar 38' may also be implemented in a connector system for production mounting of modules to the motherboard.

Figure 20:
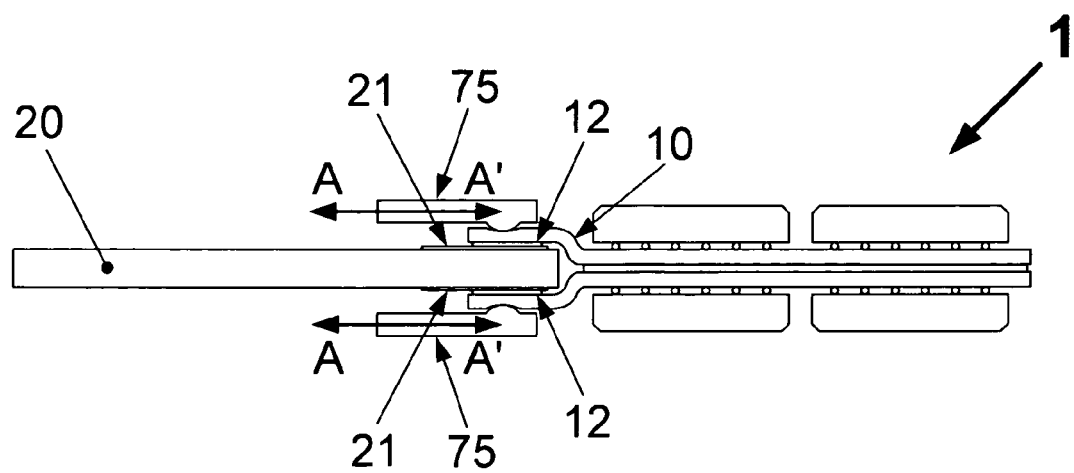
FIG. 20 illustrates schematically the bifurcated flex circuit of FIG. 2 direct-mounted to the edge of a printed circuit board or motherboard using a sliding compression connector.

In the proceeding examples the flexible circuit leads were formed at an 180° angle. However, the flexible leads shown in FIGS. 11C-D and FIG. 20 are opened slightly while keeping the two halves approximately parallel to engage contacts on both sides of a connector or edge of a PCB or motherboard.

FIG. 11D is similar to FIG. 11C, but illustrates that a "Zebra-strip" elastomeric connector 55, similar to those manufactured by Fujipoly America Corp., can replace or be integrated with the contact post 54 (not shown) to achieve the same results described above.

Figure 11E:
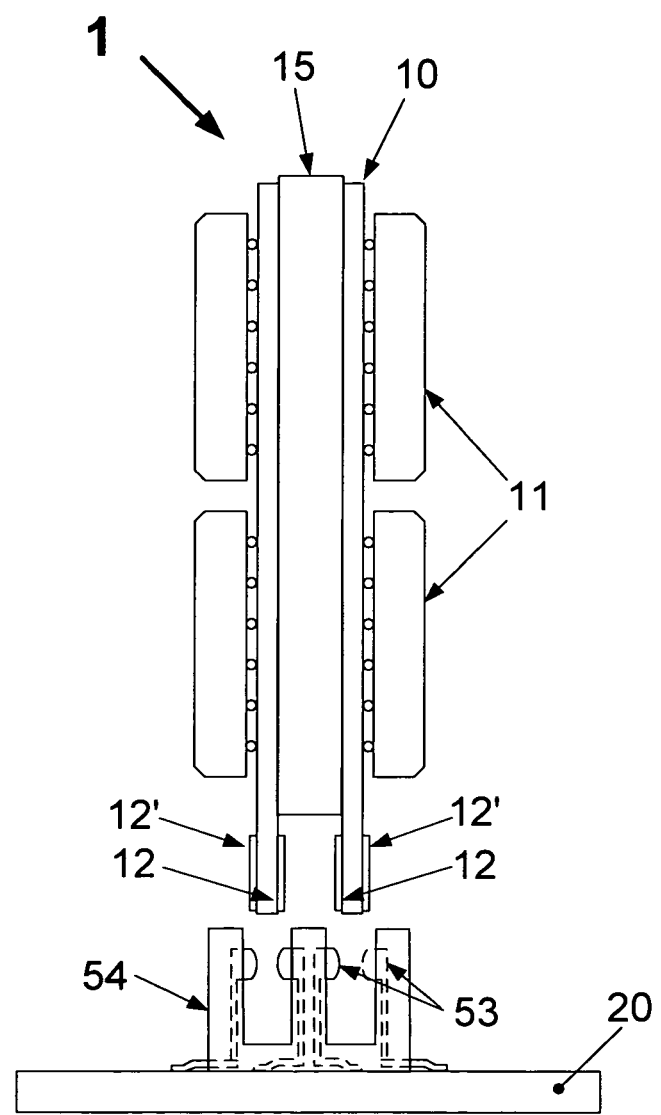
FIG. 11E illustrates a bifurcated flexible circuit formed using two separate flexible films laminated to the outer surfaces of rigid PCB substrate, similar to FIG. 5, but which extend under the electronic components mounted to the sides. The bottom contacts include pads on both the inner and outer surfaces of the flexible films, which can interface with a socket connector.
Figures 12A, 12B, 12C, 12D:
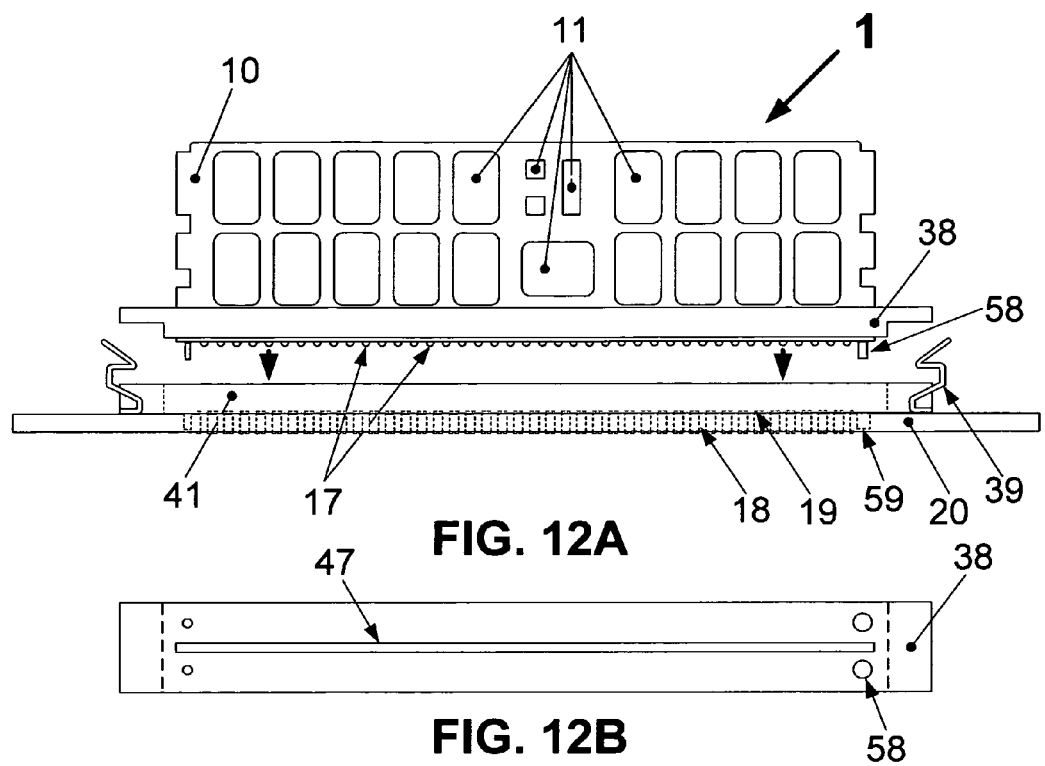
FIG. 12A illustrates schematically the side-view of a bifurcated flexible circuit inserted through a slot within a clamping collar for attachment to a compression latch assembly, according to one aspect of the invention.
FIG. 12B illustrates schematically the bottom-view of the clamping collar of FIG. 12A with a center slot and alignment posts for attachment to a compression latch assembly, according to one aspect of the invention.
FIG. 12C illustrates schematically the bottom-view of the flexible bifurcated extensions of FIG. 12A with circuit leads and conductive bumps for attachment to a motherboard by means of a compression latch assembly, according to one aspect of the invention.
FIG. 12D illustrates schematically a side-view of an interposer board for adding gold-plated contacts onto the surface of a motherboard compatible with a compression latch assembly, according to one aspect of the invention

FIG. 11E is similar to FIG. 5, but includes two separate flexible circuits laminated to the external surfaces of a rigid printed circuit board (PCB) or substrate 15 and which extend under the attached electronic components 11. The PCB or substrate and flexible circuits may be electrically connected across the interface of the laminated surfaces. Conversely, the PCB or substrate may serve only as a spacer to separate components 11 mounted to inner surfaces of the separate flexible circuits 10 (not shown).

In this example, the two separate flexible circuits form equivalent bifurcated flexible leads at the bottom that may then be spread apart, as previously described for direct mating to a motherboard, or may be connected to a motherboard using a socket 54 or connector specifically designed to engage with the bifurcated leads. In the example shown n FIG. 11E, the bifurcated leads include both inner 12 and outer 12' electrode pads which engage with the socket contacts 53.

An elevation view of an electronic subsystem 1 with a clamping collar 38 installed is illustrated in FIG. 12A. In this embodiment, a compression latch assembly 41 is also shown mounted to the PCB or motherboard 20. Assembly 41 is designed to receive and latch the integrated clamping collar 38, with attached electrode pads 12 as described for FIG. 11B, into a slot (partially shown with dotted lines) and hold the integrated collar in compression directly against the PTH annular rings 19, or vias 18, or contact pads 21, as previously described. The housing for assembly 41 would typically comprise a rigid, liquid crystal polymer (LCP) plastic or metal and would typically include threaded posts or holes at its ends and mid-point (not shown) for anchoring the housing to the motherboard using appropriate hardware. Metal spring latches or retention clips 39 located at the ends of the assembly are used to clamp the integrated clamping collar in compression against the motherboard contacts. These latches or clips 39 would preferably spring outward as the collar is pressed downward into at least a portion of the slot, and spring back to their original position to latch and hold the collar in compression against the surface of the motherboard once the collar is properly seated into the slot and sufficient compression is achieved to enable electrical function between all contact surfaces.

The length of the slot and proportionately narrow side rails of the longer assembly housings 41, may cause the housing and/or motherboard surface to bow if mated with an integrated collar that contains large numbers of contacts that require high normal forces to achieve reliable electrical connection with the motherboard. Consequently, the contact surfaces near the mid-point of the integrated collar 38 may not receive the same amount of compressive normal force as the contacts near the ends of the collar, causing potential open electrical connections in this area. To correct this problem, one solution is shown in FIG. 12E where collar 38" is itself bowed in a convex manner near the mid-point of its length and in the direction of the motherboard contacts. When properly designed and assembled, the convex-bowed collar 38" will bring the electrode pads 12 near the mid-point of its length into direct contact with the motherboard contacts first and enable higher compressive normal forces to be concentrated at this area of the motherboard. The amount of bowing required would be dependant on a number of factors, including the composition of the collar, whether metal or plastic, the length and thickness of the collar, the elastic properties of the complaint material 25, the design of the assembly housing and method of anchoring to the motherboard, etc. The skilled artisan can determine the optimal bowing through routine experimentation for a particular application.

Another solution for solving the tendency of the housing and/or motherboard surface to bow when mated in compression with the collar is to add an additional metal brace or stiffener plate 45 (FIG. 15A) directly beneath the assembly housing 41 on the opposite side of the motherboard. This metal stiffener plate would provide additional rigidity to the motherboard, which would be sandwiched in the middle between the plate on the bottom and assembly housing on the top surface. The stiffener plate and housing could be assembled together as a unit onto the motherboard using the same hardware (e.g., screws and threaded nuts) that clamp both pieces together onto the motherboard. Similar to the assembly housing described above, the stiffener plate would include an open slot along its length, to avoid metal contact with exposed PTH vias on the bottom of the motherboard, and a means at or near its mid-point to anchor the side rails of the stiffener plate together with the side rails of the assembly housing (not shown).

In the embodiment shown in FIG. 12A, the electrode pads include conductive bumps 17 arrayed across the bottom surface of the integrated clamping collar and are aligned with the PTH vias 18 and PTH annular rings 19 on motherboard 20 by means of alignment posts 58 located near the ends of the collar. These posts engage with orientation holes 59 (with or without different diameters) placed either on the motherboard or machined or molded into the compression latch assembly housing 41.

FIG. 12B shows a bottom view of the collar 38 of FIG. 12A, with the bifurcated extensions 13 removed for clarity, and FIG. 12C shows a bottom view of the same bifurcated extensions of FIG. 12A as they would appear with the leads spread apart and bonded to the bottom of the collar. A narrow open slot 47 is shown extending along the centerline for most of the length of collar 38 through which the bifurcations are inserted. Four alignment posts 58 are shown near the ends of the collar and are intended to engage with alignment holes 57 placed at the ends of the bifurcations 13. These posts help align the flexible circuit leads 16 and conductive bumps 17 with the PTH annular rings 19 and vias 18 on the PCB motherboard, as described above. It will be understood that the dimensions as shown in FIG. 12C are exemplary only and representative of the conventional spacing between conductive bumps 17 to align and engage with the motherboard PTH vias for a standard 240-pin DIMM socket, although the number of leads and bumps illustrated are reduced for purposes of clarity. The terminal edge of the bonding adhesive or film 9, which is selectively applied to produce bifurcated flexible circuit board 10, is also shown.

It is well known in the art of designing connector sockets that gold-plated contacts provide the most reliable electrical interfaces. However, to reduce costs, gold is typically used sparingly by selectively plating the surfaces of the contacts. Large PCB circuits, such as motherboards, are inherently expensive requiring multiple process steps during manufacture and risk costly yield losses with each additional process step. Therefore, adding even selectively plated gold directly to the contact pads or vias of a motherboard may be prohibitively expensive. Nevertheless, compression contacts, as described in these embodiments, would perform best when mated with gold-plated surfaces. To adapt the surface of an expensive motherboard for compatibility with the compression style contacts described herein, a gold-plated interposer board 42 is shown in cross-section in FIG. 12D. This board consists of a thin PCB, flex circuit, or molded-plastic carrier with an array of plated through hole (PTH) vias 18 to match the footprint of pads or PTH vias on the motherboard 20 (e.g. FIG. 12A). The PTH vias 18 on the interposer electrically connect pads or via annular rings 19 from the bottom to the top surface of this carrier. The top pads or annular rings would be selectively gold-plated and would mate with the conductive spheres or bumps 17 of FIG. 12C. The bottom pads or annular rings 19 would be solder coated and/or include solder balls 43 suitable for surface mount soldering to the same pattern of pads or PTH vias disposed on the motherboard. In this manner, motherboard contacts that are typically coated with a non-noble metal such as SnPb are converted to a gold-plated contact compatible with compression style connectors. These carriers can be mass-produced in large panel format and then cut or stamped to final size or, if manufactured from flexible circuits, could be produced in a reel-to-reel or roll-to-roll format and could be an inexpensive solution for providing an array of gold-plated contact pads or vias on the motherboard. The interposer 42, as described herein, may also be used for mating other types of components that require gold-plated contacts for reliable connection to the motherboard (e.g. LCD displays, ribbon-connectors, etc.).

Turning now to FIG. 12E, a different example of a compression style connector is illustrated, which retains some features currently found on standard DIMM type sockets but makes a fundamental change in the location of the contacts and direction of the forces applied when inserting or removing the modules from the socket.

Current DIMM sockets are designed to mate with contact pads arrayed along the bottom edges on both sides of the memory module's PCB substrate. DIMM socket pins apply a lateral normal force against these pads with approximately 6-8 grams per pin and are designed to rub both surfaces of the module's pads as the modules are inserted into the socket. This ensures that any surface contaminants or oxides present on the pads are abraded and the pins make good electrical contact with the pads. However, as noted earlier, the number of contact pads has increased in recent years to the point that the total amount of force required to insert or extract the modules from these standard sockets is causing frequent handling damage. The electronic industry currently forecasts a need to further increase the number of available contact pads for future memory modules assembled using newer generation DRAM components (e.g. DDR4, DDR5, etc.) to improve the signal-to-noise ratio on controlled-impedance PCB substrates by providing more power and ground connections. Many blade server computer OEMs also use very restricted enclosures and are straining to reduce the height of the socket-mounted modules while simultaneously increasing the total memory available on each module. As described below, the design shown in FIG. 12E is a major step in resolving these problems.

The electronic subsystem 1 shown in FIG. 12E is similar to FIG. 12A, except that it is integrated with a convex bowed collar 38", as previously described, and includes an alignment post 58 near the center of its length. This post mates with an orientation hole 59 molded into the compression latch assembly 41' and helps to align electrode pads 12, disposed on the bifurcations 13, with a variety of contact pins or springs, represented in FIGS. 12F-P, that are press-fitted into molded slots within the base of the plastic-molded frame of assembly 41'. Socket assembly 41' also includes two latches 51 that are designed to rotate about a pivot point and engage with the ends of the convex bowed collar 38" to clamp and hold the integrated collar in a state of compression against stamped metal socket contacts 60, 61 or 62, that are press-fitted into the plastic-molded frame or housing of the socket.

Representative examples of the types of pins or spring contacts that can be incorporated within socket assembly 41' are illustrated in FIGS. 12F-P. FIG. 12F shows pin 60 terminated at its upper tip in a short rounded point. The same pin is shown in a side-view at 60' and 60". These two side-views are identical for this particular pin design, since there is no need to produce two versions of the upper contact for 180 degrees rotation as illustrated and described below for FIGS. 12J and 12M. From the side-view 60' (and 60") it can be seen that there is an offset bend of the stamped-metal socket contact near the mid-point of its length. This offset bend is shaped such that when pin 60' is placed in vertical alignment with adjacent pins 60", which are rotated 180° in orientation as shown in FIGS. 12G-H, the lower portion of the leads alternate in a staggered pattern when viewed from either the top or bottom (not shown) and are spaced apart by 1.90 mm. FIG. 12G is a cross-section view taken at location A-A' of four staggered socket leads press-fitted into the plastic-molded frame or housing of socket 41'. The lower portion of the leads is staggered into four rows by rotating pin 60" 180° and placing it immediately adjacent to pin 60'. The upper tips of adjacent contacts 60' and 60" then form two rows that are aligned along the length of the socket, as shown in FIG. 12H. FIG. 12H is a view looking down onto a small section of the molded frame of socket 41' showing that each individual contact tip extends into and is surrounded by a molded slot 40 which provides some freedom of deflection of the upper section on the contacts. As illustrated at 60 in FIG. 12F, each individual pin includes a wide "anchoring" section near the mid-point of its length that is formed during the metal stamping process and which serves to lock the pin in position when press-fitted into a molded slot at the base of the plastic frame 41'. One embodiment of socket assembly 41' would include a frame with 240 contact pins in four rows that are spaced apart the distances shown in FIG. 12G for compatible assembly onto motherboards with PTH vias 18 patterned to receive standard 240-pin DIMM sockets.

Turning now to FIG. 12J, contact pin 61 is shown, which appears similar to pin 60 in this view, but when rotated 90 degrees reveals a "J" shaped termination 61' that is bent in the (normal) direction of its bottom lead. Pin 61", though similar to pin 61', has a reverse "J" bend that extends in the opposite direction, away from its bottom lead. FIG. 12K is similar to FIG. 12G and is a cross-section view taken at location A-A' of four staggered "J" bend leads press-fitted into the plastic-molded frame or housing of socket 41'. The lower portion of the leads is staggered into four rows by rotating pin 61" 180° and placing it immediately adjacent to pin 61'. The upper rounded tips of adjacent contacts 61' and 61" then form two upper rows that are aligned along the length of the socket, as shown in FIG. 12L. FIG. 12L is a view looking down onto a small section of the molded frame of socket 41' showing that each individual contact tip extends into and is surrounded by a molded slot 40 which provides some freedom of deflection of the upper section on the contacts. Pins 61' and 61" are formed differently during the metal stamping process to enable the "J" bends to face in the same direction (i.e. towards the centerline of frame 41') along both upper rows, as shown in FIG. 12K. Depending on the cross-sectional dimensions, leaning angle for the upper-section, and type of metal from which the pins are stamped, the "J" bend contact pins 61' and 61" can be engineered to deflect when mating with electrode pads 12 to provide a wiping action against the pads as described earlier.

Turning now to FIG. 12M, spring contact pin 62 is shown, which when rotated 90° reveals a "folded" termination 62' that is bent in the (normal) direction of its bottom lead. Pin 62", though similar to pin 62', has a reverse bend that extends in the opposite direction, away from its bottom lead. FIG. 12N is similar to FIG. 12K and is a cross-section view taken at location A-A' of four staggered "folded" leads press-fitted into the plastic-molded frame or housing of socket 41'. The lower portion of the leads is staggered into four rows by rotating pin 62" 180° and placing it immediately adjacent to pin 62'. The upper rounded tips of adjacent contacts 62' and 62" then form two upper rows that are aligned along the length of the socket, as shown in FIG. 12P. FIG. 12P is a view looking down onto a small section of the molded frame of socket 41' showing that each individual contact tip extends into and is surrounded by a molded slot 40 which provides some freedom of deflection of the upper section on the contacts. Pins 62' and 62" are likewise formed differently during the metal stamping process to enable the folded bends to face in the same direction (i.e. towards the centerline of frame 41') along both upper rows, as shown in FIG. 12N. Depending on the cross-sectional dimensions, folded angles for the upper-section, and type of metal from which the pins are stamped, the folded contact pins 62' and 62" can be engineered to deflect when mating with electrode pads 12 to provide a wiping action against the pads as described earlier.

A preferred embodiment for each of the stamped-metal contacts 60, 61 and 62 described above would include selective gold plating over the upper contact surfaces. The compression latch assembly or socket 41', as shown in FIG. 12E, includes long leads intended to be inserted through PTH vias 18 formed on the motherboard and soldered to the bottom annular rings 19 of these vias. However, the leads may also be formed with right-angle bends to enable SMT soldering to staggered pads on the top surface of the motherboard. Assembly 41', as shown in FIG. 12E, also includes two anchor posts or threaded screws 65 to aid in securing the socket to the surface of the motherboard during soldering and when clamping the integrated collar 38" into place. One preferred method for inserting subassembly 1 into socket 41' would be (a) engage a first end of the integrated collar 38" with a first latch 51 of the socket 41', and (b) apply a downward, cantilever-force on the opposite second end of collar 38" sufficient to engage the second latch of socket 41' to clamp and hold the integrated collar in compression against the socket contacts.

Figure 13:
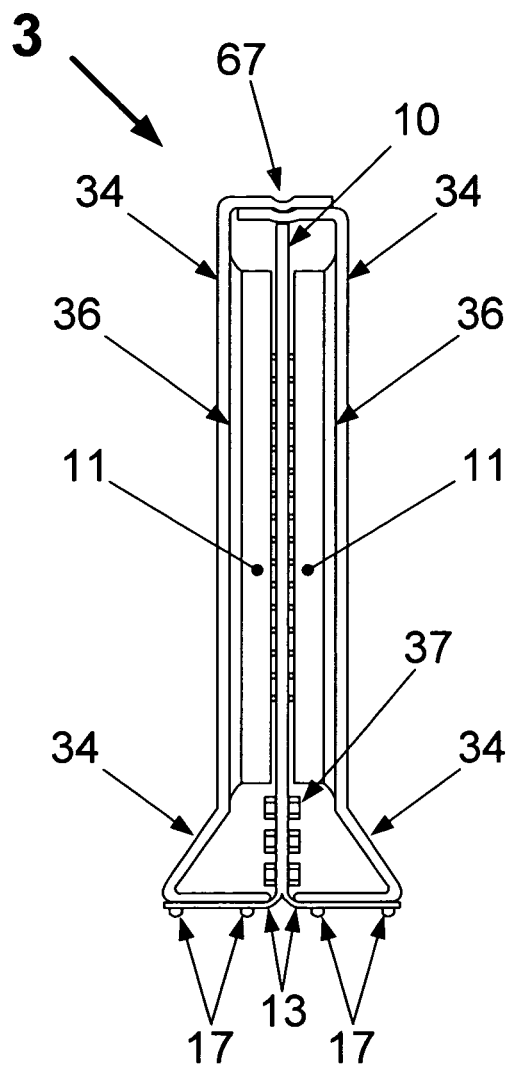
FIG. 13 illustrates schematically a cross-section view of a bifurcated flexible circuit, protected within two metal heat spreaders having angled flanges, with bifurcated extensions bonded to the bottom of the angled flanges, according to one aspect of the invention.

A cross-section of yet another example of the present invention is shown in FIG. 13. Whereas FIGS. 11 and 12 illustrate a bottom clamping collar 38, 38' or 38" that does not enclose electronic subsystem 1 or 2, this example integrates two metal heat spreaders with angled-flanges 34 that fully enclose electronic components 11 and passive chips 37 to provide a protected electronic subsystem 3. The advantages for this design include; (a) a rigid enclosure for protecting fragile bare (unpackaged) silicon devices mounted onto flexible substrate 10, (b) an adjacent heat spreading surface for the efficient removal of heat generated by the contained components 11, (c) electrostatic and electromagnetic shielding of the contained components 11, (d) a means for enabling a compressive force to be applied to contacts arrayed on the bottom surface, and (e) a means for supporting the module in direct electrical communication with contacts disposed on the motherboard.

The angled-flange metal heat spreaders 34 comprise two thin, stamped-metal housings that are near mirror images of one another. The bottom surfaces of both heat spreaders are adhesively bonded respectively to one of the two bifurcations 13 and are spaced apart from one another by the thickness of flexible circuit 10. Both legs are separated and spread apart from one another to form an angle of approximately 180°, but they remain joined together where the bonding adhesive or film 9 terminates, as previously shown in FIGS. 1, 6, and 11A-B, which in this case is near the gap between the bottom flanges of the two heat spreaders shown in FIG. 13. The resulting structure allows the two metal heat spreaders to open and close in a clamshell fashion around the bifurcated flex circuit assembly by a means of a hinge consisting of flexible extensions 13 and bonding adhesive or film 9.

The angled flanges 34 formed at the bottom of the paired heat spreaders angle outward from the narrower sidewalls and then close back together at the base to (a) provide a surface against which a downward compression force can be applied by a mating clamping device, (b) provide a flat or slightly angled mounting surface for the flexible bifurcated extensions, with sufficient width to enable contact with a standard pattern of staggered PTH vias 18 or pads 19 on the motherboard intended for mounting DIMM sockets, (c) provide a means for transferring a compression force to an array of conductive bumps 17 or electrode pads 12 (not shown) located on the exposed surface of the bifurcated extensions 13, (d) form a rigid, expanded cavity for mounting components onto the flexible substrate 10 which require greater stand-off height, and/or (e) enable the components 11 and/or passive chips 37 on flexible circuit 10 to be mounted in very close proximity to the surface of the motherboard.

Examples of devices that mate with electronic subsystem 3, for applying a downward compressive force, are disclosed below in FIGS. 15A-B and 16A-C. In these examples, angled wedges contact the outward angled-flanges 34 of the heat spreaders and apply a clamping force against the flanges, which in turn compress conductive bumps 17 directly against the contact pads, vias or pins on the motherboard. The bottom surfaces of the flanges may be flat or angled slightly downward, near the beginning of the bifurcated extensions, to help compensate for lower compressive forces resulting from any flexing of the inner edges of the flanges near the bifurcated extensions 13. The downward angled surfaces of the thin metal heat spreaders 34 also provide a means for establishing compliancy between the conductive spheres or bumps 17, arrayed on the bottom of the folded bifurcated leads, and the contact pads 21 or annular rings 19 surrounding the Plated Thru Via Holes 18 of the motherboard. In addition, the adhesive chosen to bond the flexible leads to the bottom flanges of the heat spreaders can be selected to provide a measure of compliancy.

The paired metal heat spreaders 34 of electronic subsystem 3 are held together in a closed position surrounding the bifurcated flex circuit assembly by two means; (a) an adhesive-backed Thermal Interface Material (TIM) 36, and (b) interlocking clasps 67 located along the top edge of the heat spreaders (ref. FIG. 13). The adhesive-backed TIM 36 is applied to the interior surface of the metal heat spreaders 34 in a thickness sufficient to contact and adhere to the backside surfaces of heat generating components 11 when the metal heat spreaders are folded together. A suitable TIM would be 3M™ Thermally Conductive Tape 8805, which is supplied with a contact adhesive on both sides of the tape for bonding components together. After cutting two pieces of tape to proper size, a first release liner is removed, exposing a first adhesive surface, and the tape is applied and pressed against the inside surface of both heat spreaders. When the subassembly is ready to be sealed, the second release liner is removed from both pieces of tape adhering to the inside surfaces of the heat spreaders, exposing the second adhesive surface, and the metal heat spreaders are folded and pressed together to adhere the second adhesive surfaces to the backside of the heat generating components 11. When folded and pressed together, the thermally conductive interface material 36 bridges and joins the inside surfaces of the metal heat spreaders and backside surfaces of the heat generating components on both sides of the bifurcated flexible circuit 10 to form a unified assembly that can be opened, if necessary, for rework, but which otherwise adheres together tenaciously. Additional means for securing the subassembly together is provided by a series of interlocking clasps 67 spaced along the top edges of the heat spreaders. As shown in FIG. 13, the upper edges of the heat spreaders overlap one another and are formed with interlocking indentations that snap closed when the heat spreaders are folded together. Other embodiments of interlocking clasps (not shown) would include punched-metal, interdigitated "fingers" that alternate in height above and below a nominal midpoint along the top edge of the heat spreaders and which overlap and lock together when closed.

In another preferred embodiment of FIG. 13, components 11 comprise memory devices positioned on both sides of the bifurcated flexible circuit 10, and immediately above the bottom flange of both heat spreaders, to enable the detached module-height and overall system-height of subsystem 3, when mated with motherboard 20, to be reduced to a practical minimum.

Figure 14:
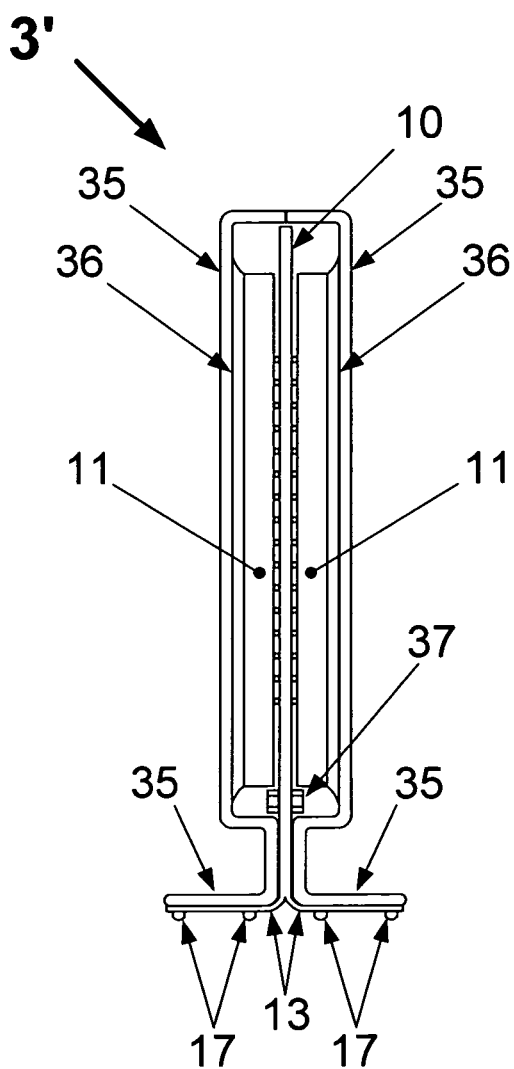
FIG. 14 illustrates schematically a cross-section view of a bifurcated flexible circuit, protected within two metal heat spreaders having diverging flanges, with bifurcated extensions bonded to the bottom of the diverging flanges, according to one aspect of the invention.

FIG. 14 is similar to the embodiment shown in FIG. 13, with exception that the flanges at the bottom of the stamped metal heat spreaders extend inward before flaring outward as two diverging-flanges 35: The diverging-flanges provide access for applying a downward compressive force from directly above the conductive bumps 17.

Figure 15A:
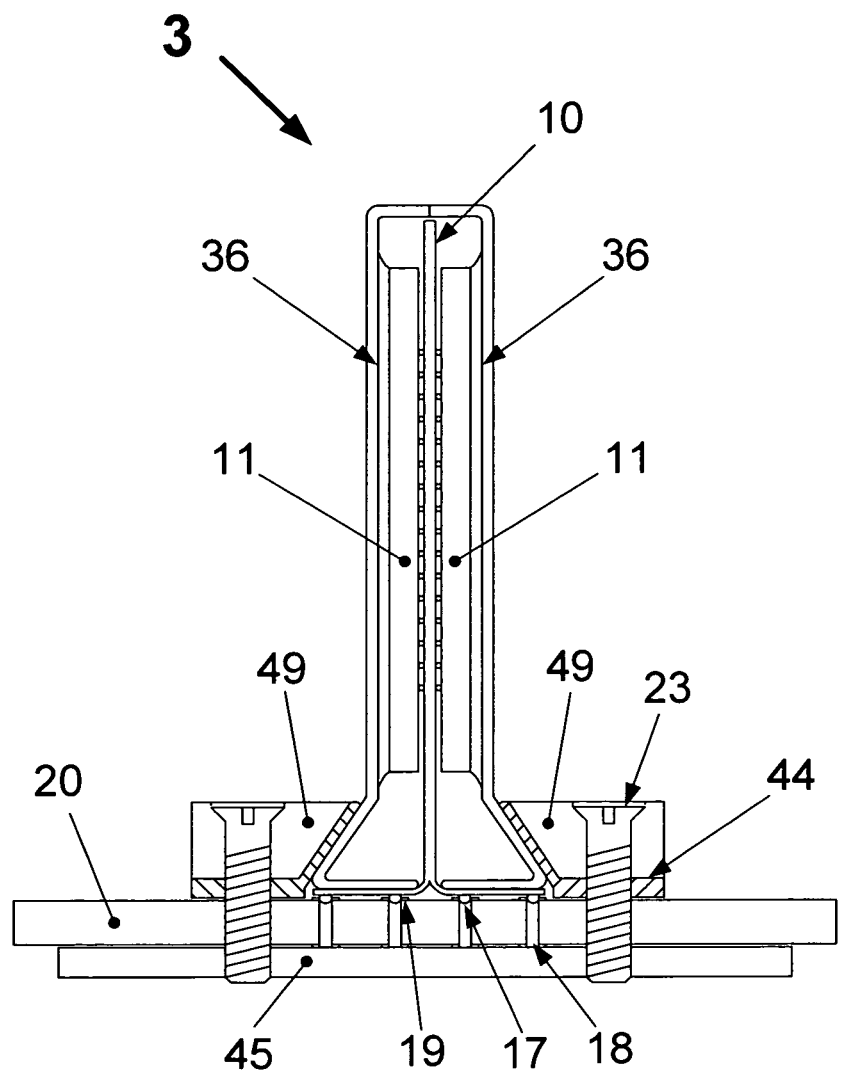
FIG. 15A illustrates schematically a cross-section view of a bifurcated flexible circuit, protected within two metal heat spreaders having angled flanges, clamped in compression against a motherboard with metal wedges, according to one aspect of the invention.

FIG. 15A is a cross-section view of the subassembly 3, similar to FIG. 13, which is directly mated under compression to the DIMM socket PTH vias 18 of motherboard 20. Two metal wedges 49 extend along both sides of the length of subassembly 3 and include compression pads 44 that contact the angled-flanges 34 and surface of the motherboard. The metal wedges may be constructed as separate pieces or from a single slotted collar that fits over the top of the subassembly 3. A downward compressive force is exerted against the angled-flanges when multiple screws 23 are tightened into a metal stiffener plate 45, similar to that as previously described that extends the length of subassembly 3 from the underside of the motherboard. Conductive bumps 17 align with and partially extend into the PTH vias 18 to make electrical contact with the inside perimeter of the annular rings 19.

FIG. 15B is a cross-section view of another embodiment of a subassembly 3', clamped in compression against motherboard 20 as previously described for FIG. 15A, but which includes a folded extension 10' of the bifurcated flexible circuit 10 with additional rows of components 11 mounted inside non-flanged metal heat spreaders 34'. This folded extension does not require any flanges on the heat spreaders and enables additional rows of components to be connected into circuit with the motherboard through the conductive bumps 17 of one pair of bifurcated extensions 13 held in compression through a single pair of metal wedges 49. By folding the flex circuit extension 10' over to one side, and inserting its end into a plastic or metal retention clip 74, which is attached to a portion of the metal wedge 49, the total height of the vertically mounted subassembly 3' is held to a minimum.

Yet another embodiment for a low-profile subassembly 4 is shown in FIG. 15C. In this embodiment, subassembly 4 is clamped parallel to motherboard 20 and the bifurcated flex circuit 10 includes a first right-angle fold 68 towards the bottom edge of a non-flanged heat spreader 34' and a second right-angle fold 69 of a first-portion of the bifurcated extensions 13 that is positioned between a lower portion of the heat spreader and PTH annular rings 19 of the motherboard. The other second-portion of the bifurcated extension includes a third right-angle fold 70 in the opposite direction from that of the first-portion. This second-portion of the bifurcated extension is positioned between a compression pad 44 of clamping device 22 and the PTH annular rings 19 of the motherboard 20. In this embodiment, the clamping device 22 simultaneously applies a downward compressive force through compression pads 44 along (a) an upper-portion of the non-flanged metal heat spreader 34", and (b) the second-portion of the bifurcated extension 13. Screws 23 or other hardware devices can be fastened or threaded into a bottom metal stiffener plate 45 or tightened against the plate with a lock nut 24. Since the second-portion of the bifurcated extension is positioned at a different height above the surface of the motherboard, a thicker layer of compression pad 44 or different compliant material 25 may be needed in areas of clamping device 22 that make direct contact with the motherboard.

Figure 15:
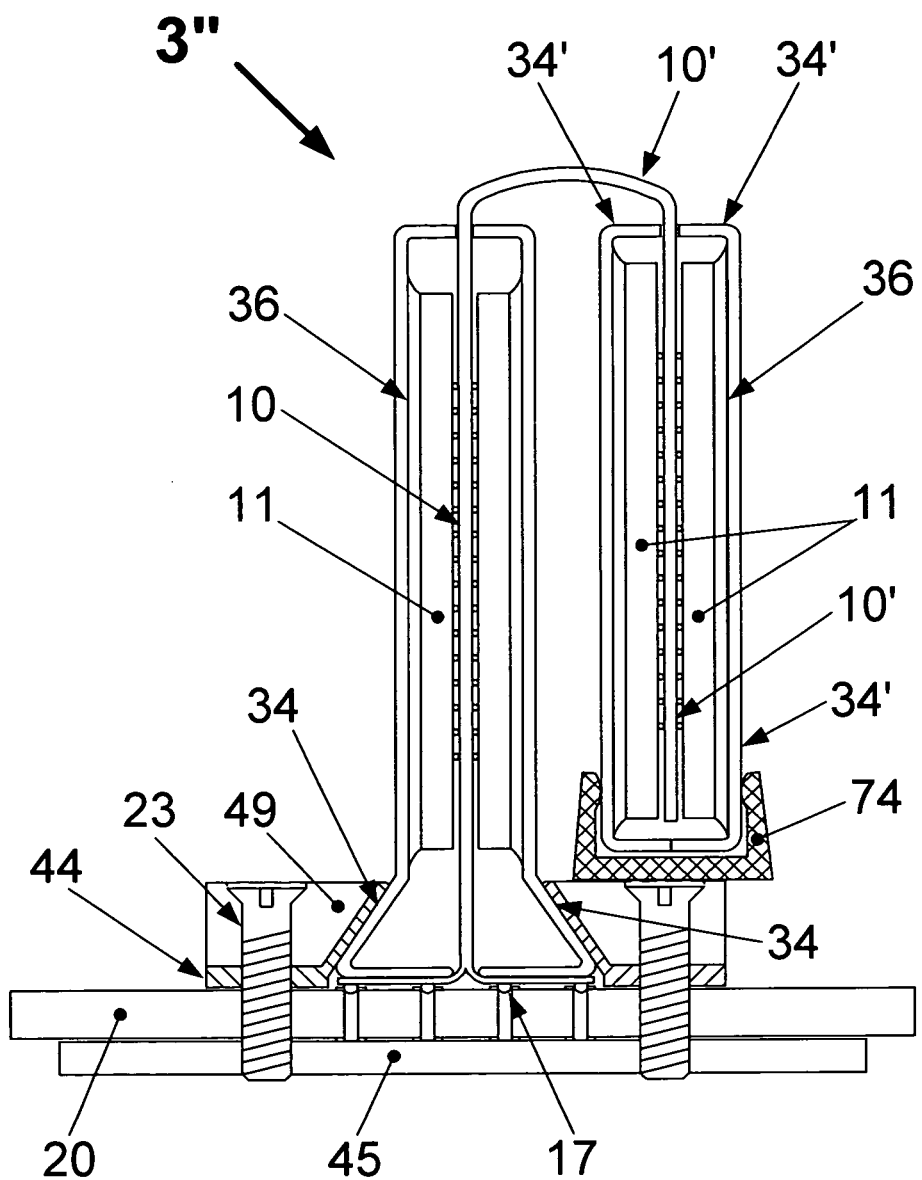
FIG. 15B illustrates the embodiment of FIG. 15A with a bifurcated flexible circuit having a folded extension with additional components, protected within metal heat spreaders without flanges, according to one aspect of the invention.
FIG. 15C illustrates schematically a cross-section view of a bifurcated flexible circuit, protected within two metal heat spreaders without flanges, clamped in compression horizontally against a motherboard with a clamping device, according to one aspect of the invention.
FIG. 15D illustrates the embodiment of FIG. 15C, which includes a folded extension with additional components, protected within metal heat spreaders without flanges, clamped in compression horizontally to the top surface of a motherboard with a single clamping device, according to one aspect of the invention.
FIG. 15E illustrates the embodiment of FIG. 15C clamped in compression horizontally on both sides of a motherboard with two clamping devices, according to another aspect of the invention.
Figure 15:
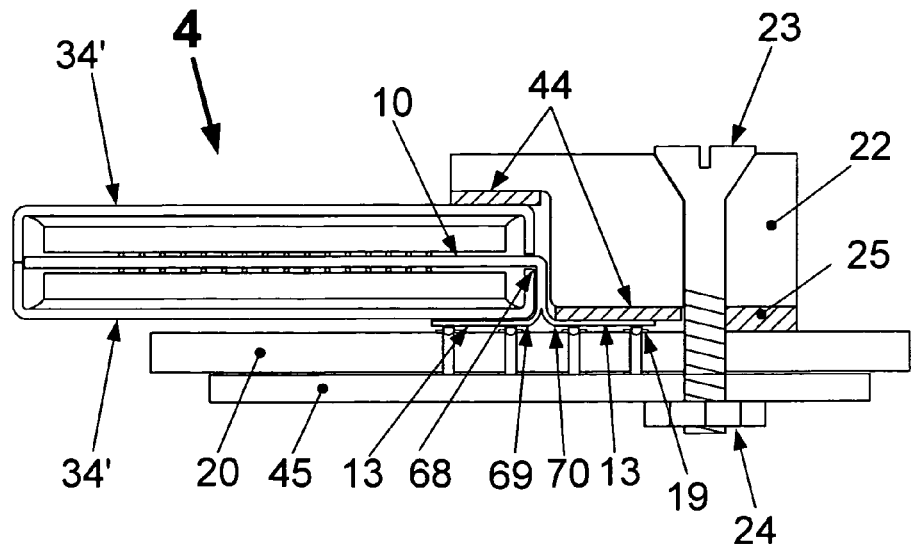
Figure 15:
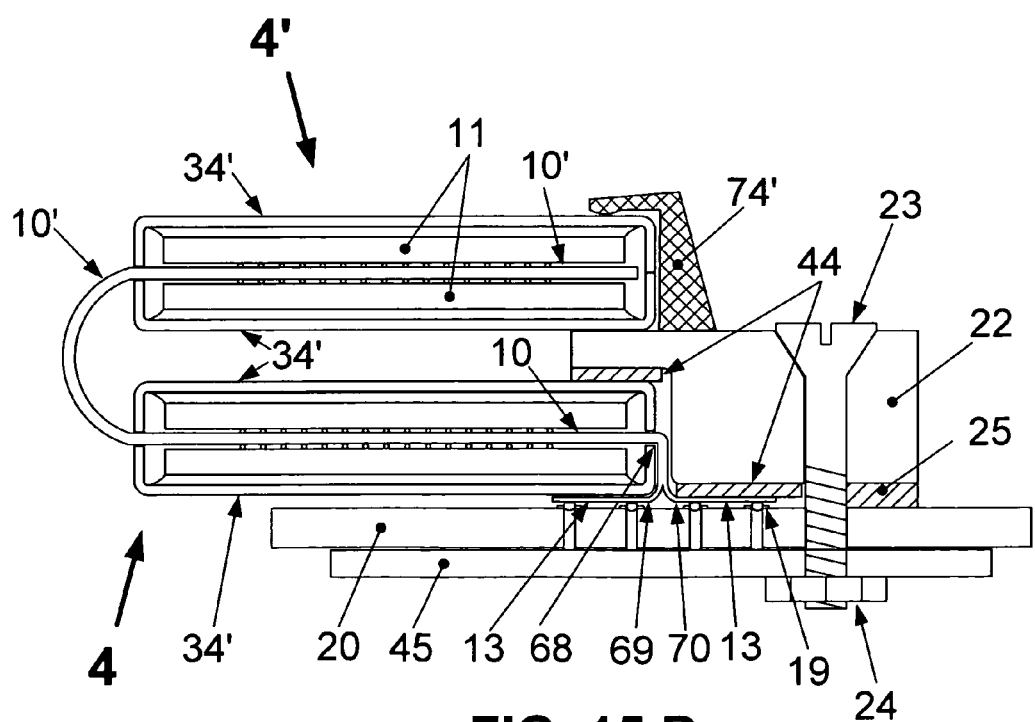

FIG. 15D is similar to FIG. 15B, and illustrates how the low-profile subassembly 4 of FIG. 15 C can include a folded low-profile subassembly 4' positioned above it. In this embodiment, folded low-profile subassembly 4' is electrically connected to the bottom low-profile subassembly 4 by means of a folded extension 10' of the bifurcated flexible circuit 10. Subassembly 4' is sufficiently spaced above subassembly 4 to enable adequate air flow between the adjacent subassemblies for efficient component cooling and is held in position with a plastic or metal retention clip 74', similar to that shown in FIG. 15B, that is attached to clamping device 22.

Turning now to FIG. 15E, two low-profile subassemblies 4 are positioned above and below the surface of the motherboard 20. The upper subassembly is clamped to the motherboard similar to FIG. 15C described above, but the lower subassembly is connected to the motherboard through a signal translation interposer board 56. This board reroutes the signal functions coming from the bottom-side of the motherboard so that are correctly aligned with the electrode pads on the bifurcated extensions 13 of this lower subassembly. If the bifurcated flexible circuits 10 of the upper and lower subassemblies were exact mirror images of each other, the signal translation interposer board would not be required. However, using mirror imaged circuits may be a more expensive solution than using a simple signal translation interposed board. The signal translation interposer board 56 is preferably pre-attached to the bottom-side of the motherboard 20. However, it may also be pre-attached to the bifurcated flex circuit 10 and held into compression against the PTH annular rings 19 of the motherboard.

The additional stand-off height caused by the presence of the signal translation interposer board 56 may enable various electronic components 11 to be soldered to the bottom surface of the motherboard 20 that are thicker than otherwise allowed beneath the upper subassembly, as shown in FIG. 15D. The clamping devices 22 may also use common hardware fasteners 23 for drawing the clamps together to provide the required compression forces against the upper and lower bifurcated extensions 13 of subassemblies 4.

Figure 16A:
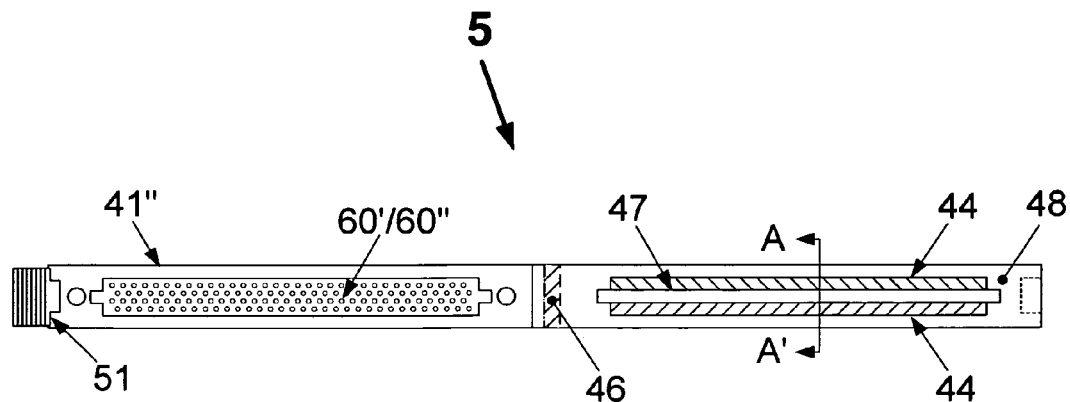
FIG. 16A illustrates schematically a top-view of a direct connect socket for bifurcated flexible circuits protected within metal heat spreaders having angled flanges, according to one aspect of the invention.
Figure 16B:
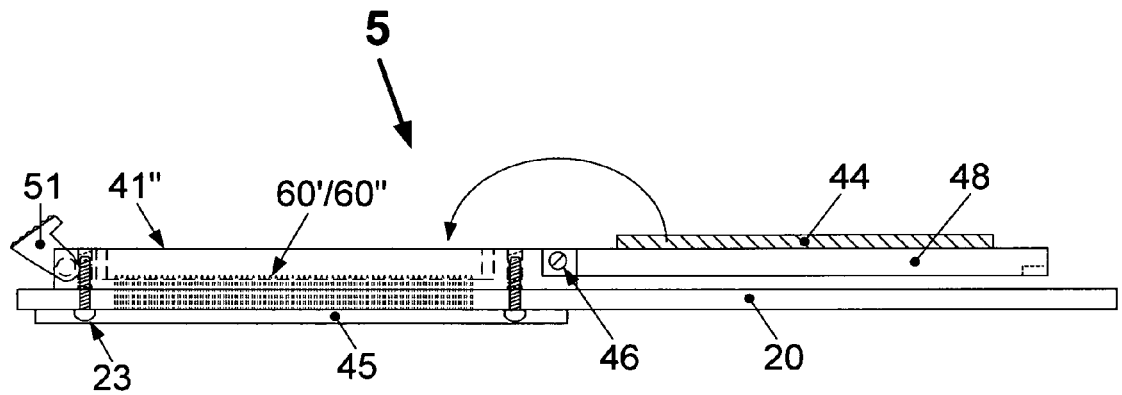
FIG. 16B illustrates schematically a side-view of a direct connect socket for bifurcated flexible circuits protected within metal heat spreaders having angled flanges, according to one aspect of the invention.
Figure 16C:
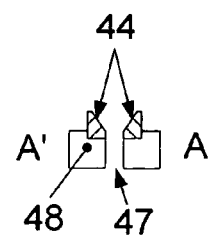
FIG. 16C illustrates schematically a cross-section view of a pivoting compression clamp for metal heat spreaders having angled flanges, according to one aspect of the invention.

A Direct Connect Socket 5, for easy installment and removal of the protected electronic subassembly 3 (refer to FIG. 13), is illustrated in FIGS. 16 A-C. To avoid the manufacturing difficulties associated with assembling devices to motherboards using multiple clamps, screws and nuts, a simpler connector concept is shown here that uses a pivoting compression clamp 48 and compression latch assembly 41" to simultaneously apply a downward compression force to both angled-flanges of the metal heat spreaders 34. FIG. 16A is a top view, looking down onto the direct connect socket, while FIG. 16B is a side view of the same socket. The pivoting compression clamp is attached to the compression latch assembly with a pivot pin 46 that enables the clamp to rotate in a 180° arc in the direction of the arrow. The clamp is preferably made of a metal or rigid molded plastic as previously described for the clamping collar 38 of FIG. 11A. However, in this example the compression clamp 48 includes two angled compression pads 44 that are shaped to conform to the surfaces of the angled-flanges on the heat spreaders. The cross-section A-A', as shown in FIG. 16C, shows the angled compression pads 44 bonded to the metal or plastic pivoting clamp 48.

For this embodiment, the compression latch assembly 41" is fashioned from molded LCP plastic and includes an array of straight, stamped-metal, contact pins 60' and 60", as previously described for FIGS. 12E-H, that are press-fitted into the base of the latch assembly. In FIG. 16B, these pins are shown inserted through PTH vias placed on the motherboard 20 and soldered from the bottom side to the motherboard similar to a standard DIMM socket. A metal stiffener plate 45 may or may not be required, depending on the amount of compression force required for proper operation of the socket and the degree of flexing of the motherboard. It should be noted that the metal stiffener would either provide clearance slots or an insulating surface to prevent electrical shorting of the exposed pins exiting from the bottom of the motherboard. In this embodiment, two screws 23 extend up through the metal stiffener 45 and screw into a threaded hole or insert within the compression latch.

To operate the Direct Connect Socket 5, shown in FIGS. 16A-C, subassembly 3 is first inserted into the base of the compression latch assembly 41" and seated in alignment with the pins 60' and 60" arrayed across the bottom. The pivoting compression clamp 48 is then rotated over and down onto the angled-flanges 34' of the metal heat spreaders. The open slot 47, as shown in FIGS. 16A and 16C, allows the upper sections of the heat spreaders 34 to pass between the two angled compression pads 44 and through the compression clamp 48 so that a collar, similar to 38' of FIG. 11C, extends around the bottom periphery of subassembly 3. A downward compression force is then applied against the angled-flanges 34' by pressing against the free-end of the compression clamp 48 until the latch 51 can be engaged to hold the clamp in place.

In another embodiment, Direct Connect Socket 5' (not shown) includes other press-fitted pins or contacts, such as "J-bend" contacts 61' and 61" or spring contacts 62' and 62" previously shown and described for FIGS. 12J-P. In yet another embodiment, Direct Connect Socket 5" (not shown) does not include any integrated, press-fitted, pins or contacts within the compression latch assembly 41", but allows the electrode pads 12 or conductive spheres or bumps 17 arrayed on the bifurcated extensions 13 to directly contact the motherboard PTH vias 18 and/or annular rings 19 as previously shown and described (e.g. FIGS. 6-7). In yet another embodiment, Direct Connect Socket 5''' (not shown) allows the electrode pads 12 to directly contact an array of protruding pins 27 from separate "bed-of-nails" connector 26 soldered to the bottom of the motherboard as previously described in FIG. 8A-B.

Figure 17A:
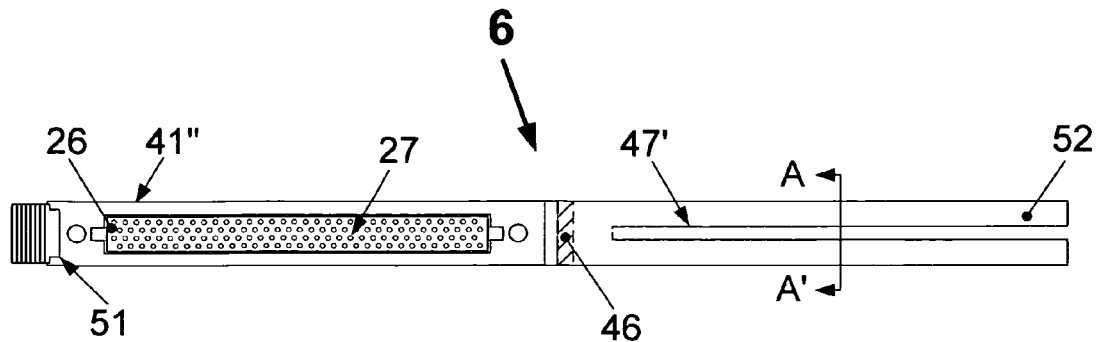
FIG. 17A illustrates schematically a top-view of a direct connect socket for bifurcated flexible circuits protected within metal heat spreaders having diverging flanges, according to one aspect of the invention.
Figure 17B:
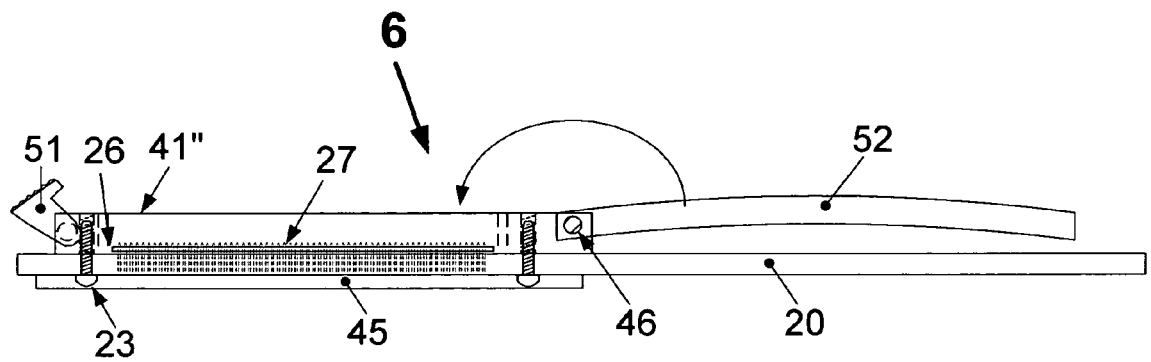
FIG. 17B illustrates schematically a side-view of a direct connect socket for bifurcated flexible circuits protected within metal heat spreaders having diverging flanges, according to one aspect of the invention.
Figure 17C:
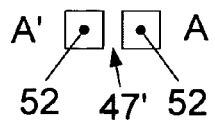
FIG. 17C illustrates schematically a cross-section view of a pivoting compression clamp for metal heat spreaders having diverging flanges, according to one aspect of the invention.

Another Direct Connect Socket 6, intended to mate with electronic subassembly 3' (refer to FIG. 14), is illustrated in FIGS. 17 A-C. This embodiment includes many features similar to that described and shown in FIGS. 16A-C. However, this socket uses a bifurcated compression clamp 52 that is slightly bowed near its center point and which includes an open-ended slot 47' that is not closed at the end. The open-ended slot 47' engages with the diverging-flanges 35 of subassembly 3' by allowing the flanges to slide into the slot from the open-end after the bifurcated compression clamp 52 is rotated towards the top of its travel. The open-ended slot 47', as shown in FIGS. 17A and C, allows the bifurcated clamp 52 to surround both sides of subassembly 3' while sliding along the length of the divergent-flanges 35. When fully engaged, the bifurcated clamp 52 appears similar to the collar 38 shown in FIGS. 11A and 12A-B, and extends almost completely around the bottom periphery of subassembly 3'.

As the bifurcated compression clamp is lowered towards the compression latch assembly 41", subassembly 3' is seated within a molded cavity and is brought into alignment with protruding pins 27 of a "bed-of-nails" connector 26 arrayed across the bottom. The pivoting compression clamp 52 is then rotated down against the diverging-flanges 35 of both metal heat spreaders, applying a downward compression force as latch 51 is engaged to retain the clamp in compression. As noted earlier, the bottom of the bifurcated clamp may or may not include a layer of compliant material 25.

In the illustration shown in FIG. 17B, the "bed-of-nails" connector 26 is preassembled onto the top surface of the motherboard 20 with the tails of the protruding pins 27 extending down through the PTH vias 18 and soldered from the bottom of the motherboard. As noted earlier for FIG. 8A, the "bed-of-nails" connector may also be preassembled on the bottom surface of the motherboard with the protruding pins 27 extending up through the PTH vias. Various pins may also be press-fitted into the base of the latch assembly 41" as previously described for FIG. 16. The bifurcated compression clamp 52, viewed in this figure, is also slightly bowed near its center point in order to function as previously described for the bowed collar 38" in FIG. 12E.

Figure 18A:
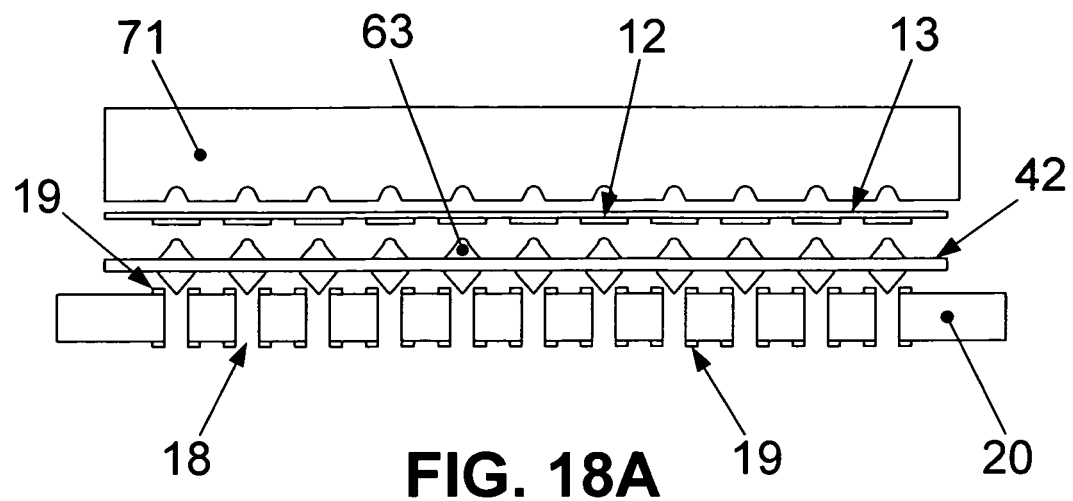
FIG. 18A illustrates schematically a cross-section view of an interposer board having bladed contacts and a concave dimpled clamping collar for mechanical forming and electrical mating with the electrode pads of a bifurcated flexible circuit, according to one aspect of the invention.
Figure 18B:
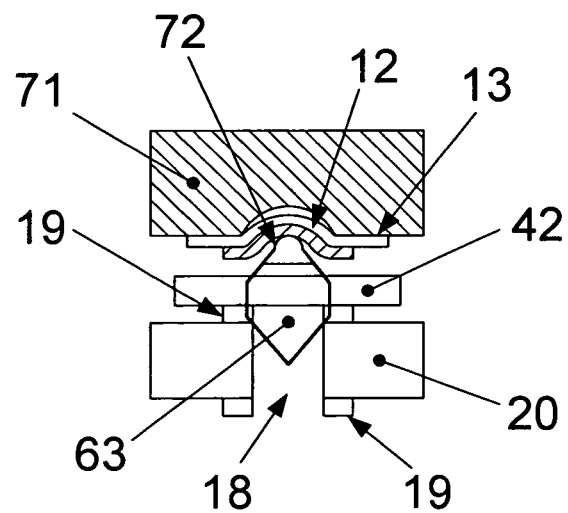
FIG. 18B illustrates schematically a close-up, cross-section view of FIG. 18 A.

Turning now to FIGS. 18A-B, a small section of interposer board 42 is shown in cross-section together with a new clamping collar 71 that includes a concave-dimpled surface. As previously described for FIG. 12D, interposer board 42 is fashioned from a thin PCB, flexible circuit, or molded-plastic carrier. However, instead of containing an array of plated through hole (PTH) vias 18, this embodiment includes bladed contacts 63, fashioned from stamped metal with selectively gold-plated tips 72, which are pressed fitted into a thin PCB or plastic molded interposer to match the footprint of pads or PTH vias on the motherboard 20. The bladed contacts are pointed on the bottom-side of the interposer to aid in their alignment with the PTH vias of the motherboard and in penetrating the edges of the PTH annular rings 19 when collar 71 applies a downward compression force from above. The gold-plated tips 72 of contacts 63 are aligned with the concave dimples on the bottom surface of collar 71 and are rounded at their tips with a radius smaller than the radius of the concave dimples. When the thin electrode pads 12, arrayed on the flexible bifurcated extensions 13, are aligned and compressed between the tips of contacts 63 and concave dimples of collar 71, the thin pads 12 are partially deformed into the concave dimples and create a "ball and socket" like connection, as shown in the close-up cross-section of FIG. 18B. Electrode pads 12 are typically fashioned from thin copper films ($\leq 40$ μm thick and finished with a thin nickel-gold coating to resist tarnishing) bonded to thin polyimide films ($\leq 50$ μm thick) which can be easily deformed. This type of compression connection is intended to improve electrical reliability of the interposer contacts when (a) they are subject to temperature cycling during operation, or (b) the PTH annular rings 19 of motherboard 20 are solder-coated.

Alternative materials that can be substituted for interposer board 42 include polyimide, Mylar, PVC, and PEC films, etc. Alternative compression-type contacts 63 that can be integrated with interposer 42 include gold-fuzz buttons (bumps), isotropic conductive epoxy bumps, copper-plated bumps, etc. (not shown), that are disposed directly above and below one another on both sides of the film, similar to that shown in FIG. 18, and are interconnected through small plated or non-plated vias within the film, as shown in FIG. 12D.

FIGS. 18A-B indicate that the concave dimples are arrayed on the bottom surface of clamping collar 71, which is similar to 38 shown in FIGS. 11A and B. However, it should be noted, the concave dimples can also be integrated into the compliant material 25 bonded to the bottom surface of collar 38, or fashioned into the bottom surfaces of metal heat spreaders formed with either angled-flanges 34 or divergent-flanges 35 (FIGS. 13 and 14).

Figure 18C:
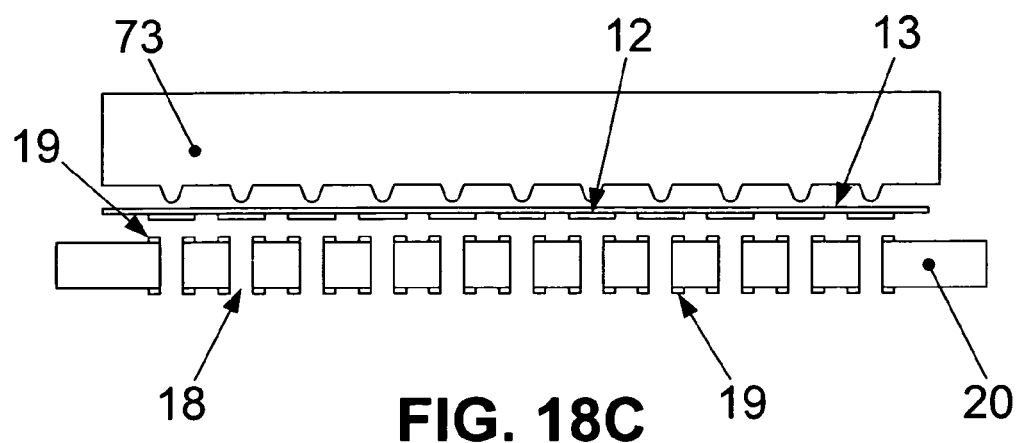
FIG. 18C illustrates schematically a cross-section view of a convex dimpled clamping collar for mechanical forming and electrical mating with the electrode pads of a bifurcated flexible circuit, according to one aspect of the invention.
Figure 18D:
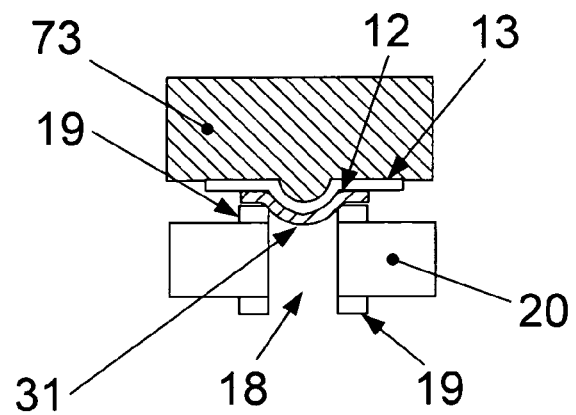
FIG. 18D illustrates schematically a close-up, cross-section view of FIG. 18 C.

Turning now to FIGS. 18C-D, a small section of a convex-dimpled clamping collar 73 is shown in cross-section together with thin electrode pads 12, arrayed on a flexible bifurcated extension 13 and aligned above PTH vias 18 and annular rings 19 of motherboard 20. As previously shown and described for FIGS. 9 and 10B and shown again in the close-up cross-section of FIG. 18D, convex dimples will deform the thin bifurcated extension film 13 and bottom electrode pad 12 when a downward compressive force is applied through the clamping collar 73, forcing the electrode pad into electrical contact with the annular ring 19 of the motherboard 20. However, it is preferred with this embodiment and previously discussed, that the annular rings on the motherboard include a gold plated finish for this compression contact to form a reliable connection. In addition, it is desirable that convex dimple radius be smaller than the radius of the PTH via 18 in order for the electrode pad to be partially pressed into the via hole, as shown in FIG. 18D. It should also be noted, these convex dimples can also be integrated into the compliant material 25 bonded to the bottom surface of collar 38, or fashioned into the bottom surfaces of metal heat spreaders formed with either angled-flanges 34 or divergent-flanges 35 (FIGS. 13-14).

Figure 19:
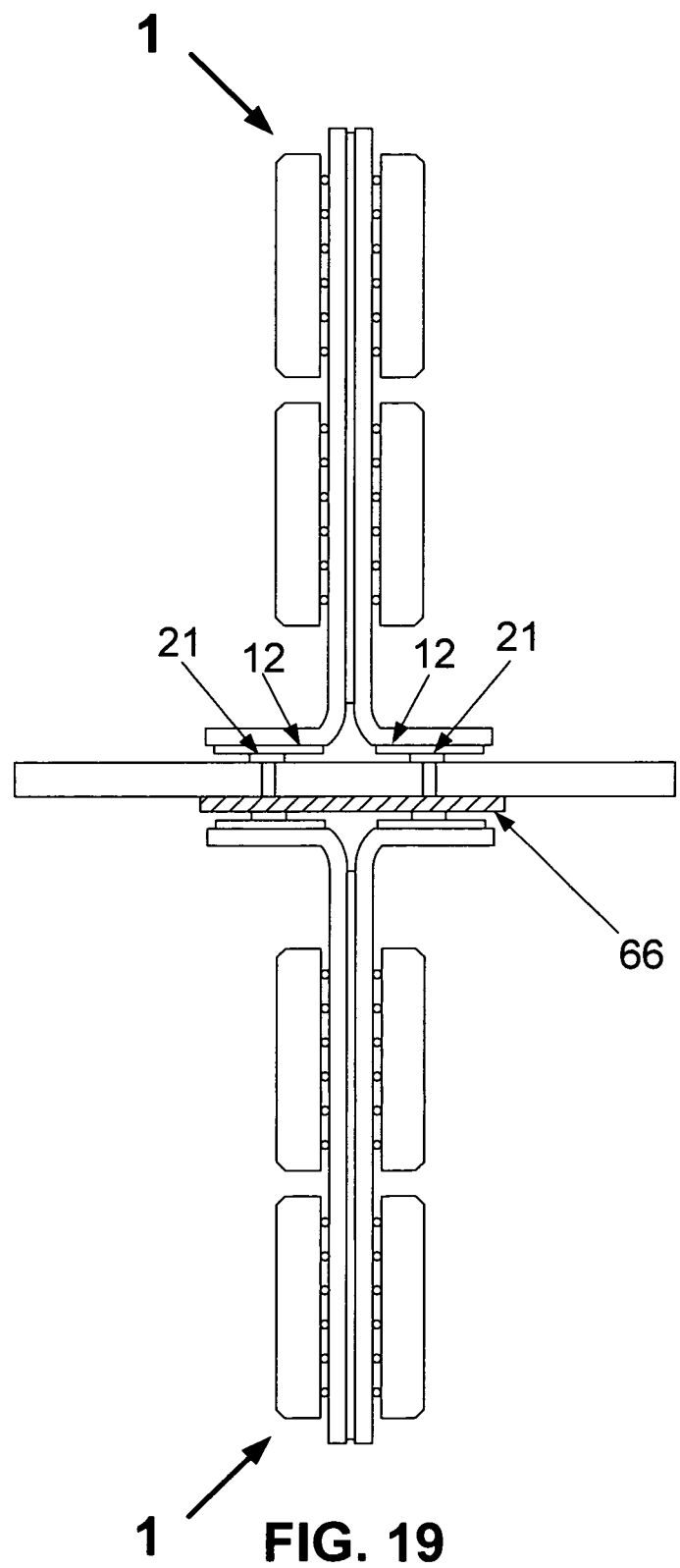
FIG. 19 illustrates schematically the bifurcated flex circuit of FIG. 2 direct-mounted on both the top and bottom surface of a printed circuit board or motherboard using shared contacts of the motherboard by means of a contact translation board.

As previously described for FIG. 2, the electronic subsystem 1 can be electrically and mechanically connected to contacts 21 on the motherboard 20 by various means to electrode pads 12 on the flexible bifurcated extensions 13. In FIG. 15E, it was also demonstrated that two subassemblies 4' could be mounted on both top and bottom surfaces of a motherboard 20 and share the same PTH via contacts 19 by means of a signal translation interposer board 56. Turning now to FIG. 19, a similar embodiment is shown wherein two subsystems 1 are electrically and mechanically connected to contacts 21 from both sides of motherboard 20 by means of another contact translation circuit 66.

Another novel configuration for mounting the electronic subsystem 1 is illustrated in FIG. 20. In this example the bifurcated flexible leads are opened sufficient to straddle the edge of a PCB or motherboard 20 which includes contacts 21 arrayed along its edge. The inner electrode pads 12 of the flexible leads are aligned to these contacts and compressed together to mechanically and electrically connect the electronic subsystem in the plane of the motherboard. In the example shown, a sliding compression clamp or connector 75 can be moved from position A to A' to lock the aligned bifurcated leads against the motherboard contacts and apply a pinching force that establishes electrical connections between the inner electrode pads and PCB contacts. It will be appreciated that once the two halves of the bifurcated flexible leads are aligned, any clamping device may suffice to enable electrical/mechanical mating of the module to the motherboard.

INDEX OF REFERENCE NUMERALS USED IN THE DRAWING FIGURES

1 Electronic Subsystem (with bifurcated flexible circuit board or substrate)
1' Flexed Electronic Subsystem (~45° clockwise)
1" Flexed Electronic Subsystem (~90° counter-clockwise)
2 Electronic Subsystem (with rigid circuit board or substrate)
3 Protected Electronic Subsystem (with angled-flanges)

3' Protected Electronic Subsystem (with divergent-flanges)
3" Protected Electronic Subsystem (with angled-flanges and folded extension)
4 Low-Profile Protected Electronic Subsystem
5 Direct Connect Socket—Angled Flanges
6 Direct Connect Socket—Divergent Flanges
9 Bonding adhesive or film
10 Bifurcated flexible circuit
10' Folded extension
11 Various electronic components
12 Inner electrode pads
12' Outer electrode pads
13 Bifurcated extension or leg
14 Compliant region
15 Rigid printed circuit board (PCB) daughter card or substrate
16 Flexible circuit leads
17 Conductive spheres or bumps
18 Plated Through Hole (PTH) via
19 PTH annular ring
20 Printed Circuit Board (PCB) or motherboard
21 PCB or motherboard contacts
22 Clamping device
22' Clamping device (with integrated flex circuit connector)
22" Clamping device (with integrated compression posts)
23 Screw or fastener
24 Lock nut
25 Compliant material
26 "Bed-of-nails" connector
27 Protruding pins
28 Solder fillet
29 Compression post
30 Housing
30' Enclosure (full-height)
30" Enclosure (reduced-height)
31 Formed electrode pad
32 Pierced electrode pad
33 Slotted portion of the electrode pad
34 Angled-flange metal heat spreader
34' Non-flanged metal heat spreader
35 Diverging-flange metal heat spreader
36 Thermal Interface Material (TIM)
37 Passive chip components
38 Clamping collar
38' Collar with tapered slot
38" Convex bowed collar
39 Spring latch or retention clip
40 Molded slot
40' Angled slots
41 Compression latch assembly
41' Compression latch assembly (with stamped metal leads)
41" Compression latch assembly (with pivoting compression clamp)
42 Interposer
43 Solder ball
44 Compression pad(s)
45 Metal stiffener plate
46 Pivot pin
47 Open slot
47' Open-ended slot
48 Pivoting compression clamp
49 Metal wedge
50 Flex circuit connector
51 Latch
52 Bifurcated compression clamp
53 Socket contact
54 Socket housing
55 Zebra-strip connector
56 Signal translation interposer board
57 Alignment hole
58 Alignment post
59 Orientation holes
60 Stamped metal socket contact—straight
60' Stamped metal socket contact—straight side-view with normal bend
60" Stamped metal socket contact—straight side-view with reverse bend
61 Stamped metal socket contact—J-bend
61' Stamped metal socket contact—J-bend side-view with normal bend
61" Stamped metal socket contact—J-bend side-view with reverse bend
62 Stamped metal socket contact—spring
62' Stamped metal socket contact—spring side-view with normal bend
62" Stamped metal socket contact—spring side-view with reverse bend
63 Interposer contacts
64 Bifurcated lead—partially reflexed
64' Bifurcated lead—fully reflexed
65 Anchor post or screw
66 Contacts translation circuit
67 Interlocking clasp
68 First fold
69 Second fold
70 Third fold
71 Concave-dimpled clamping collar
72 Gold-plated tip
73 Convex-dimpled clamping collar
74 Plastic or metal retention clip
75 Sliding compression clamp
76 Metal contact pin

We claim:

1. An electronic module comprising:
a multilayer circuit board having a bifurcated area along one edge thereof and a plurality of electronic components mounted on at least one surface thereof;
a plurality of electrode pads functionally connected to said electronic components and positioned on the inner surfaces of said bifurcated area so that when the two legs of said bifurcated area are spread apart by about 180° said electrode pads align with respective contacts on a motherboard, and are connectable thereto, so that a secure connection may be created between said circuit board and said motherboard; and,
two metal, heat spreading covers lockably enclosing said circuit board, one on either side, said covers further providing mating surfaces upon which a mechanical clamping device can engage and secure said module to a motherboard.

2. The electronic module of claim 1 wherein said multilayer circuit board is selected from the group consisting of: flexible circuits and rigid circuit boards.

3. The electronic module of claim 1 wherein said heat spreading covers are shaped to provide an enclosed space for mounting passive devices on said circuit board.

4. The electronic module of claim 1 wherein said electronic components are selected from the group consisting of: logic devices; memory devices; buffer circuits; timing circuits; analog, digital and mixed-mode circuits; optoelectronic devices; RF devices; resistors; capacitors; inductors; and antennas.

5. The electronic module of claim 1 wherein said motherboard is part of a computing device and said multilayer flex circuit comprises a memory module.

6. The electronic module of claim 5 wherein said computing device is selected from the group consisting of: desktop computers; mobile computers; tablet computers; smart phones; and servers.

7. A method for making an electronic module comprising the steps of:

forming a multilayer circuit board having a bifurcated area along one edge thereof and a plurality of electronic components mounted on at least one surface thereof;

forming a plurality of electrode pads functionally connected to said electronic components and positioned on the inner surfaces of said bifurcated area;

reflexing each leg of said bifurcation by about 90° so that said electrode pads align with respective contacts on a motherboard; and, enclosing said circuit board between two lockably engaging metal heat spreading covers, said covers further providing mating surfaces upon which a mechanical clamping device can engage and secure said module to a motherboard.

8. The method of claim 7 wherein said multilayer circuit board is selected from the group consisting of: flexible circuits and rigid circuit boards.

9. The method of claim 7 wherein said heat spreading covers are shaped to provide an enclosed space for mounting passive devices on said circuit board.

10. The method of claim 7 wherein said electronic components are selected from the group consisting of: logic devices; memory devices; buffer circuits; timing circuits; analog, digital and mixed-mode circuits; optoelectronic devices; RF devices; resistors; capacitors; inductors; and antennas.

11. The method of claim 7 wherein said motherboard is part of a computing device and said multilayer flex circuit comprises a memory module.

12. The method of claim 11 wherein said computing device is selected from the group consisting of: desktop computers; mobile computers; tablet computers; smart phones; and servers.

* * * * *